(12) United States Patent
Kamada

(10) Patent No.: US 6,263,473 B1
(45) Date of Patent: Jul. 17, 2001

(54) VITERBI DECODER AND VITERBI DECODING METHOD

(75) Inventor: Takehiro Kamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/494,362

(22) Filed: Jan. 31, 2000

Related U.S. Application Data

(63) Continuation of application No. 08/833,483, filed on Apr. 7, 1997, now Pat. No. 6,041,433.

(51) Int. Cl.[7] .................................................. H03M 13/41
(52) U.S. Cl. .............................................................. 714/795
(58) Field of Search ................................................ 714/795

(56) References Cited

U.S. PATENT DOCUMENTS

| | | | |
|---|---|---|---|
| 5,841,819 | * 11/1998 | Hu et al. ........................... | 375/341 |
| 5,996,112 | * 11/1999 | Dabiri et al. ..................... | 714/795 |

FOREIGN PATENT DOCUMENTS

| | | |
|---|---|---|
| 63-26035 | 2/1988 | (JP) . |
| 64-17518 | 1/1989 | (JP) . |
| 1-291525 | 11/1989 | (JP) . |
| 8-251038 | 9/1996 | (JP) . |
| 9-51278 | 2/1997 | (JP) . |
| 9-64755 | 3/1997 | (JP) . |

OTHER PUBLICATIONS

G. Edwards, "A 45-Mbits/sec. VLSI Viterbi Decoder for Digital Video Applications", IEEE National Telesystems Conf., pp. 127–130, 1993.

W.R. Kirkland et al., "High-speed Viterbi Decoder Memory Design", Canadian Journal of Electrical and Computer Engineering, vol. 15, No. 3, pp. 107–114, 1990.

G. Feygin et al., "Architectural Tradeoffs for Survivor Sequence Memory Management in Viterbi Decoders", IEEE Transactions on Communications, vol. 41, No. 3, pp. 425–429, 1993.

* cited by examiner

*Primary Examiner*—Stephen M. Baker
(74) *Attorney, Agent, or Firm*—McDermott, Will & Emery

(57) ABSTRACT

The present invention provides an improved Viterbi decoder with a trace-back memory that requires a much less storage capacity required for signal decoding processing as compared with a commonly-used trace-back memory. Based on an input received code, an add-compare-select (ACS) circuit generates path select (PS) signals, and m generated PS signals per unit are written into a path storing means and are fed to a starting node number deciding circuit where the number m indicates a trace-back length. The starting node number deciding circuit finds from the m PS signals a trace-back starting node number for a PS signal preceding the m PS signals. PS signals are read out from the path storing means, trace-back processing starts from the starting node number found by the starting node number deciding circuit, and signal decoding processing is carried out. This eliminates the need for providing a state of performing provisional trace-back processing for finding a starting node number, thereby reducing the number of states necessary for the decoding of signals from four down to three. This reduces the storage capacity of memory required for storing PS signals and thereby achieves a considerable reduction of the circuit size.

4 Claims, 20 Drawing Sheets

Fig. 9(a) MOST LIKELY PATH

Fig. 9(b) FIRST MEMORY 301

SECOND MEMORY 302

VITERBI DECODER AND VITERBI DECODING METHOD

This application is a continuation of application Ser. No. 08/833,483 filed Apr. 7, 1997, now U.S. Pat. No. 6,041,433.

BACKGROUND OF THE INVENTION

This invention relates to a path trace type Viterbi decoder for use in error correction decoding of convolutional codes and to a Viterbi decoding method.

Viterbi decoders for use in maximum likelihood decoding of convolutional codes find applications in transmission systems susceptible to transmission errors such as satellite communications systems and satellite broadcasting because of their high error correction performance. As demodulating circuits evolve in the rate of operation and in the level of integration, low-power, fast Viterbi decoders are in great demand.

FIG. 14 shows an example of a convolutional code encoder having three shift registers 13a–c. This encoder generates from data Y of one bit a convolutional code X1 of one bit and a convolutional code X0 of one bit. The shift register 13a holds data S1 that was inputted earlier than data Y by two data items. The shift register 13b holds data S0 that was inputted earlier than data Y by one data item. The shift register 13c holds data Y that is the currently-inputted data. Code X1 is obtained from data S1 and data Y, which is represented as $[1+D^2]$. Code X0 is found from data S1, data S0, and data Y, which is represented as $[1+D+D^2]$. The number of shift registers contained in an encoder is the encoder constraint length (the number is three in FIG. 14).

The state of the encoder shown in FIG. 14 is determined by two bits, i.e., data S1 held in the shift register 13a and data S0 held in the shift register 13b (the state S1S0). Codes X1 and X0, which are convolutional codes produced in respective states, are univocally defined according to the input data Y. Suppose that FIG. 15(a) shows a situation in which codes X1 and X0 are outputted when data Y is inputted in the state S1S0. In this case, the operation of the encoder of FIG. 14 may be represented by a state transition diagram of FIG. 15(b). For instance, when data 1 is entered in state 01, 10 is produced as a convolutional code and, at the same time, the encoder makes a transition to state 11 by the shift operation of a shift register. The number of encoder states is $2^{(K-1)}$ where K is the constraint length of a convolutional code.

The trellis diagram is a diagram in which paths stretching out from respective states are time-arranged in the horizontal direction. FIG. 16 is a trellis diagram that is prepared on the basis of the state transition diagram of FIG. 15(b). With reference to FIG. 16, solid line arrows extending from the individual states 00, 01, 10, and 11 each indicate a path when input data Y is 0 and broken line arrows each indicate a path when input data Y is 1. A point corresponding to a state is called a node.

In Viterbi decoding, a path having a distance nearest to a transmitted code series, known in the art as a most likely path, is found on a trellis diagram such as the one shown in FIG. 16, and decoding processing is carried out by tracing back the most likely path.

For example, with respect to the point a of the trellis diagram of FIG. 16, the encoder is in state 01. This encoder state results from the fact that data 1 is fed in state 00 or the fact that data 1 is fed in state 10. The operation of the encoder at this time is shown in FIG. 17. As can be seen from FIG. 17, input of data 1 in state 00 results in a shift-out of data 0 from the shift register. On the other hand, input of data 1 in state 10 results in a shift-out of data 1 from the shift register. The data shifted out becomes a path select (PS) signal indicative of from which of the states the path arrives. In other words, a PS signal becomes 0 when a path arrives from above (i.e., from state 00) and, on the other hand, it becomes 1 when a path arrives from below (from state 10).

Accordingly, PS signals at nodes through which the most likely path passes become shifted-out signals from the encoder (previously-input signals) and decoding processing is carried out by tracing back the most likely path to find the PS signals at the nodes.

A commonly-used Viterbi decoder is now described below.

A Viterbi decoder was reported in a paper entitled "A 45-Mbit/sec. VLSI Viterbi Decoder for Digital Video Applications," IEEE Natl Telesystems Conf. Vol. 1993, p. 127–130, 93. STANFORD TELECOM. In this Viterbi decoder, a multiported memory is divided into four trace-back memories and the operation of each of the trace-back memories is pipelined with a view to achieving a high-speed and low-power Viterbi decoder.

FIG. 18 illustrates in block form the structure of a conventional Viterbi decoder. 801 is an add-compare-select (ACS) circuit for generating path select (PS) signals from input received codes. 802 is a trace-back memory formed of a multiported memory. 803 is a trace-back circuit. 804 is an address generating circuit. 805 is a timing generating circuit for controlling the operation timing of the entire Viterbi decoder. Trace-back memory 802 is divided into four banks (bank0, bank1, bank 2, bank3). In each bank0–3, the data bit width is $2^{(K-1)}$ and the number of words is m, where K is the constraint length of an encoder on the sending side and m is the trace-back length which is used as a trace-back unit in decoding operation.

ACS circuit 801 comprises a branch metric generating means 806 which inputs received codes and generates a plurality of branch metrics, an adder 807, a comparator 808, a selector 809, and a path metric memory 810 for storing a path metric.

With reference to FIG. 19(a), a way of finding a PS signal by ACS circuit 801 is described. FIG. 19(a) is a trellis diagram of an encoder with a constraint length of three, showing only paths indicated by PS signals at respective nodes at respective times. The symbol rate, f, represents the time at which the received code is inputted.

An example case of finding a PS signal at node 2 at time (T0+f), is explained. The path metric of a path which has the possibility of arriving at node 2 at time (T0+f), is first calculated. The path with the possibility of arriving at node 2 at time (T0+f) is a path which passes node 1 or node 3 at time T0. Suppose that the path metric of a path that passes through node 1 at time T0 is PM1 and the path metric of a path that passes through node 3 at time T0 is PM3. The path metrics are stored in path metric storing means 810.

Branch metric generating means 806 generates a plurality of branch metrics for received codes which were entered at time (T0+f). Suppose that the branch metric at the time of branching from node 1 to node 2 is BM12 and the branch metric at the time of branching from node 3 to node 2 is BM32. At this time, the path metric of a path that reaches node 2 by way of node 1 is (PM1+BM12) and the path metric of a path that reaches node 2 by way of node 3 is (PM3+BM32). These add operations are performed in adder 807.

The more likely Path has a lower metric. Two path metrics of two paths are compared in comparator 808. Comparator 808 produces a PS signal corresponding to a path having a smaller path metric. In response to the PS signal received from comparator 808, selector 809 selects a path metric which is then stored in path metric storing means 810.

Since a path, which reaches node 2 by way of node 1, is selected at node 2 in time (T0+f), the PS signal is 0. ACS circuit 801 performs arithmetic operations of PS signals for the respective nodes when the received code is inputted. For this reason, the number of bits of a PS signal produced from ACS circuit 801 is equal to the number of nodes, that is, the number of states of the encoder. In FIG. 19, the number of nodes is 4, for the encoder constraint length is three. Accordingly, the number of PS signal bits becomes four. As shown in FIG. 19(b), the output PS signals from ACS circuit 801 are written into trace-back memory 802 according to the write addresses generated in address generating circuit 804.

Signal decoding by a trace back technique is explained. As described previously, PS signals at nodes through which the most likely path passes become decoded signals, in other words, signal decoding can be carried out by finding a most likely path on a trellis diagram. If a path formed by a solid line of FIG. 19 is a most likely path, then signal decoding can be done by tracing back from node 1 because the most likely path passes node 1 at time (T0+5f).

If the PS signal at node i is PSi, a node number through which the most likely path passes one symbol earlier (j) may be given by:

$$j = PSi \cdot 2^{(K-2)} + [i/2] \quad \ldots \text{(Equation 1)}$$

where [x] is the largest integer not exceeding x.

Since the PS signal at node 1 at time (T0+5f) is "0", "0" is produced as a decoded signal. Substituting i=1 and PSi=0 in Equation (1), j=0. This shows that the number of a node through which the most likely path passes at time (T0+4f) is 0. Since the PS signal at node 0 at time (T0+4f) is "1", a "1" is then produced as a decoded signal.

Substituting i=0 and PSi=1 in Equation (1), j=2. This shows that the number of a node through which the most likely path passes at time (T0+3f) is 2. Since the PS signal at node 2 at time (T0+3f) is "1", a "1" is then produced as a decoded signal. Thereafter, the most likely path is traced back in the same way as above and a series of decoded signals becomes {0, 1, 1, 0, 0, 0}. As the decoded signals are obtained in a sequence opposite to that in which the decoded signals were transmitted, the decoded signals are time-relationship reversed to become {0, 0, 0, 1, 1, 0}. By performing a trace-back along the most likely path, signal decoding is carried out.

However, in order to perform a trace-back operation such as the foregoing trace back operation, it is necessary to find a starting node number from which the trace-back operation commences.

FIG. 19(a) shows that all the paths, which arrive at nodes 0 to 3 at time (T0+5f), pass through the same node (i.e., node 0) at time T0. Further, it is obvious that the most likely path before time T0 passes through node 0 at time T0. Generally speaking, the paths, which arrive at their respective nodes, pass through the same node at a past point traced back several times the constraint length K. Accordingly, it is not until time (T0+5f) that the number of a node through which the most likely path passes at time T0 is detected.

Referring now to FIG. 20, the operation of the Viterbi decoder of FIG. 20 is described. FIG. 20(a) shows a most likely path, generated from a receiving code, from time T0 to time T5. FIG. 20(b) shows the operating states of from bank0 to bank3 of trace-back memory 802 from time T0 to time T5.

In State1, m PS signals, generated in ACS circuit 801, are written in each bank of trace-back memory 802. Since bank0 is in State1 in the period from time T0 to time T1, PS signals are written in bank0. Since bank1 is in State1 in the period from time T1 to time T2, PS signals are written in bank1. Likewise, PS signals are written in bank2 in the period from time T2 to time T3 and PS signals are written in bank3 in the period from time T3 to time T4.

To decode a sending signal from the PS signals from time T0 to time T1, it is required to find a node number A through which the most likely path passes at time T1. The node number A can be obtained by tracing back the PS signals from time T1 to time T2 from any node, the reason for which is that all the paths, which pass through their respective nodes at time T2, pass through a specific node through which the most likely path passes at time T1. Such a provisional trace-back is carried out in State2.

Accordingly, the node number A is found when State2 of bank1 ends. When bank1 is in State2, bank2 enters State3 without access.

Finally, in State4, the most likely path is traced back and sending signal decoding is carried out. Bank0 is in State4 in the period from time T3 to time T4. The most likely path is traced back from node A, and the sending signals between time T0 and time T1 are decoded from the result of the trace-back operation. Likewise, bank1 is in State4 in the period from time T4 to time T5, the most likely path is traced back from node B found in State2 of bank2. The sending signals between time T1 and time T2 are decoded from the result of the trace-back operation.

The operating state of each of the banks changes in cycles for decoding operation, in other words the operation of the FIG. 18 Viterbi decoder is pipelined. Trace-back circuit 803 is required to include a time-reversing means because decoding with a trace-back technique is carried out in an opposite order to the sending order.

The received code symbol rate equals the received code decoding rate by such a pipelined trace-back, thereby making it possible to implement fast decoding operations. Additionally, reduction in the consumption of electric power is achieved because trace-back memory 802 can be formed by a conventional RAM.

The prior art Viterbi decoder, however, has the following drawbacks.

In order to provide improved error correction performance in Viterbi decoding, it is necessary to sufficiently increase the trace-back length, m, with respect to the constraint length K. However, greater trace-back length requires greater trace memory storage capacity. In addition, trace-back memory 802 of the FIG. 18 Viterbi decoder requires four banks, which is not preferable in terms of device integration.

Additionally, a multiported memory is employed in the conventional Viterbi decoder, therefore producing the problem that constraints on the speed up of device occur with increasing the size of memory.

SUMMARY OF THE INVENTION

Bearing in mind the above-described problems with the prior art techniques, the present invention was made. Therefore, it is an object of this invention to provide an improved Viterbi decoder and Viterbi decoding method having not only the ability to further reduce the storage capacity of trace-back memory necessary for signal decoding when compared with conventional techniques but also the ability to achieve high integration, low power consumption, and fast operations.

The present invention provides a Viterbi decoding method for decoding convolution-coded received codes wherein a plurality of storage units are employed, each of the plurality of storage units having the ability to store path select signals for one trace-back length, the Viterbi decoding method comprising:

(a) a first step of:

writing path select signals for one trace-back length, generated from received codes, into one of the plurality of storage units and, at the same time, finding, from the path select signals written into the one of the plurality of storage units, the terminal node number of a most likely path for decoding Path select signals for one trace-back length, written into an other of the plurality of storage units, preceding the path select signals written into the one of the plurality of storage units; and (b) a second step of performing trace-back operations on the path select signals written into the other of the plurality of storage units by using the terminal node number found in the first step as a starting node number, for signal decoding.

In accordance with the present invention, both a process of writing path select signals for one trace-back length generated from received codes into one to storage unit and a process of finding the terminal node number of a most likely path for decoding Path select signals for one trace-back length written into an other storage unit preceding the path select signals written into the one storage unit, are carried out at the same time in the first step. In other words, two different processes, which are carried out separately in conventional techniques, are simultaneously performed in the present invention. This eliminates the need for performing a provisional trace-back operation for finding a most likely path terminal node number and thereby reduces the time of processing. The rate of signal decoding is improved in comparison with prior art techniques.

It is preferred that in the aforesaid Viterbi decoding method the operating state of each of the plurality of storage units changes in such a way as to sequentially and cyclically enter the following operating states, the including:

(a) a first state for performing the first step in which a first selected storage unit is used as the one of the plurality of storage units;

(b) a second state for waiting for the first step to be executed during which a second selected storage unit of the plurality of storage Units is the one of the Plurality of Storage units into which path select signals for one trace-back length following path select signals written into the First selected storage unit in the first step carried out in the first state are Written; and (c) a third state for performing the second step in which the said storage unit is used as the other of the plurality of storage units.

As a result of such arrangement, decoding of signals for one trace-back length can be performed by sequentially changing the operating state of each storage unit to the first operating state, to the second operating state, and to the third operating state. In other words, the present invention eliminates the need for the operating state for a provisional trace-back process of finding a most likely path terminal node number. As a result, the number of operating states required for the decoding of signals is reduced from four to three. Conventionally, four storage units are required for continuous signal decoding. However, in accordance with the present invention, only three storage units are required, whereby the capacity of storage required for storing path select signals can be reduced.

It is preferred that in the above-described Viterbi decoding method that:

(a) each of the plurality of storage units is formed such that each storage unit has the ability to perform, in parallel, the first step in which the said storage unit is used as the one of the plurality of storage units and the second step in which the said storage unit is used as the other of the plurality of storage units;

(b) the operating state of each storage unit changes in such a way as to sequentially and cyclically enter the following, the including:

(i) a first state for performing both the second step in which a first selected storage unit is used as the other of the plurality of storage units and the first step wherein the first selected storage unit is used as the one of the plurality of storage units; and (ii) a second state for waiting for the first step to be executed during Which a second selected a storage unit of the plurality of storage Units is the one of the Plurality of Storage units to which path select signals following path select signals written into the First selected unit in the first step carried out in the first state are written, the aforesaid Written.

Decoding of signals for one trace-back length can be carried out by sequentially changing the operating state of each storage unit to the first state, to the second state, and to the first state. Decoding of further signals for one trace-back length can be carried out by sequentially changing the operating state of each storage unit to the second state and to the first state. In other words, the number of operating states necessary for signal decoding processing is further decreased from three down to two. In accordance with this invention, it is sufficient to provide only two storage units having the ability to execute, in parallel, the first step in which the said storage unit is used as the one storage unit and the second step in which the said storage unit is used as the other storage unit. Accordingly, the capacity of storage for storing path select signals can be reduced to a further extent.

The present invention provides a Viterbi decoder for decoding input received codes by a path trace technique wherein the constraint length of an encoder on the sending side is K and the trace-back length as a trace-back unit for decoding is m, each of the number K and the number m being a positive integer, the Viterbi decoder comprising:

(a) an add-compare-select (ACS) circuit for accepting the received codes and for generating in response each of the received codes a path select signal of $2^{(K-1)}$ bits, each of the $2^{(K-1)}$ bits corresponding to a respective node indicative of a state of the encoder;

(b) path storing means for storing m path select signals per unit from the ACS circuit;

(c) a starting node number deciding circuit for receiving m path select signals per unit from the ACS circuit and for determining, based on the m path select signals, a starting node number which is the number of a node through which a most likely path Passes of a path select signal just before the m path select signals; and (d) a trace-back circuit for receiving m path select signals from the path storing means and for sequentially performing trace-back operations on the m path select signals from a bit corresponding to the starting node number determined by the starting node number deciding circuit, for signal decoding;

wherein:

when m path select signals from the ACS circuit are written into the path storing means while a starting node number is determined by the starting node number deciding circuit, m path select signals, generated prior to the m path select signals, are read out in a sequence opposite to that in which the m select signals were written, and the m path select signals thus read are traced back by the trace-back circuit from a bit corresponding to the starting node number.

In accordance with the present invention, m path select signals per unit produced in the ACS circuit are written into the path storing means. At this time, the starting node number deciding circuit determines a node number through which the most likely path passes in a path select signal just before the m path select signals written into the path storing means. This node number becomes a starting node number at the time of tracing back m path select signals generated before the aforesaid m path select signals. The m path select signals with a determined starting node number are read out from the path storing means in a sequence opposite to that in which they were written, and are traced back by the trace-back circuit in sequence from a bit corresponding to the determined starting node number for signal decoding. To sum up, it becomes possible to perform a process of writing m path select signals generated from received codes into the path storing means simultaneously with a process of finding a starting node number for m path select signals preceding the aforesaid m path select signals. This makes it possible to reduce processing time necessary for performing provisional trace-back operation required in conventional techniques for finding a starting node number. Faster decoding operations can be achieved in comparison with prior art techniques.

Additionally, it becomes unnecessary to provide an operating state in which a provisional trace-back operation to find a starting node number is carried out. As a result, the number of operating states necessary for signal decoding processing can be reduced from four down to three. Conventionally, the path storing means is required to be able to store 4m path select signals. However, in accordance with the present invention, it is sufficient for the path storing means to store 3m path select signals at the most. The capacity of storage necessary for storing path select signals may be reduced thereby realizing a considerable reduction of the circuit size.

It is preferred in the aforesaid Viterbi decoder that:
the starting node number deciding circuit is provided with $2^{(K-1)}$ node deciding circuits corresponding to bits of a path select signal, i.e., nodes of the encoder;
each of the $2^{(K-1)}$ node deciding circuits including:
(a) node number calculating means for receiving a corresponding bit of a path select signal applied to the starting node number deciding circuit to the said node deciding circuit and for calculating a node number through which a path, which arrives at a node corresponding to the bit, passed in a path select signal just before the path select signal;
(b) node number storing means for storing a node number;
(c) first selecting means for receiving node numbers stored in the node number storing means of each of the node deciding circuits and for selecting a node number stored in a node number storing means of a node deciding circuit corresponding to a node number calculated by the node number calculating means; and
(d) second selecting means for selecting between a node number calculated by the node number calculating means and a node number selected by the first selecting means for forwarding to the node number storing means;

wherein:
when m path select signals are applied to the starting node number deciding circuit, the second selecting means selects, at the time when the first of the m path select signals is applied, a node number calculated by the node number calculating means while the second selecting means selects, at the time when the second to mth of the m path select signals are applied, a node number selected by the first selecting means, and after the mth of the m path select signals is applied the node number stored in the node number storing means becomes the starting node number.

Such arrangement makes it possible to implement the aforesaid starting node number deciding circuit with a simple configuration.

It is preferred in the foregoing Viterbi decoder that:
the path storing means includes:
(a) a first, a second, and a third storage unit;
each storage unit having a storage area for storing m path select signals per unit from the ACS circuit, the bit width and the number of words of said storage area being $2^{(K-1)}$ and m, respectively;
(b) an address generating circuit for generating write and read addresses for the first to third storage units;
(c) a signal writing circuit for sequentially selecting one of the first to third storage units and for writing, according to a write address generated by the address generating circuit, a path select signal from the ACS circuit into a storage unit selected; and
(d) a signal reading circuit for sequentially selecting one of the first to third storage units and for reading, according to a read address generated by the address generating circuit, a path select signal from a storage unit selected.

As a result of such arrangement, the total storage capacity of Storage units required in the present embodiment becomes ¾ of that required in the conventional technique. Additionally, it becomes possible to use a singleported memory thereby achieving a considerable reduction of the layout area. The rate of operation is further improved.

It is preferred in the aforesaid Viterbi decoder that:
the path storing means includes:
(a) a first and a second storage unit;
each storage unit having a storage area for storing m path select signals per unit from the ACS circuit, the bit width and the number of words of the storage area being $2^{(K-1)}$ and (m+a), respectively, where the number a is either 0 or a positive integer;
(b) an address generating circuit for generating write and read addresses for the first and second storage units;
(c) a signal writing circuit for selecting between the first storage unit and the second storage unit in alternate fashion and for writing, according to a write address generated by the address generating circuit, a path select signal from the ACS circuit into a storage unit selected;
(d) a signal reading circuit for selecting between the first storage unit and the second storage unit in alternate fashion and for reading, according to a read address generated by the address generating circuit, a path select signal from a selected storage unit;

wherein:
the address generating circuit, at the time of providing write addresses in ascending order, provides a write address together with a value, obtained by adding a number of a to the write address, as a read address, while on the other hand the address generating circuit, at the time of providing write addresses in descending order, provides a write address together with a value, obtained by subtracting a number of a from the write address, as a read address; and when m path select signals are written into one of the first and second storage units according to write addresses generated in the address generating circuit, m path select signals are read out from the one of the first and second storage units according to read addresses generated in the address generating circuit.

Accordingly, when m path select signals are written into one of the storage units, m path select signals are read out from the storage unit in question. At this time, the address generating circuit provides write and read addresses in order that the m path select signals stored in the storage unit are not updated before being read out therefrom, in other words path select signal writing and tracing-back are performed in parallel on a single storage unit. Additionally, it is sufficient that the storage capacity of each storage unit is increased by a words. This cuts the storage capacity of each storage unit approximately in half when compared with conventional techniques thereby achieving a considerable reduction of the circuit size.

BRIEF DESCRIPTION OF THE DRAWINGS

FIG. 3, comprised of (a) and (b), is a diagram showing details of the operation of the starting node number deciding circuit in FIG. 2, in which

DETAILED DESCRIPTION OF THE INVENTION

First Embodiment

Figure 1:
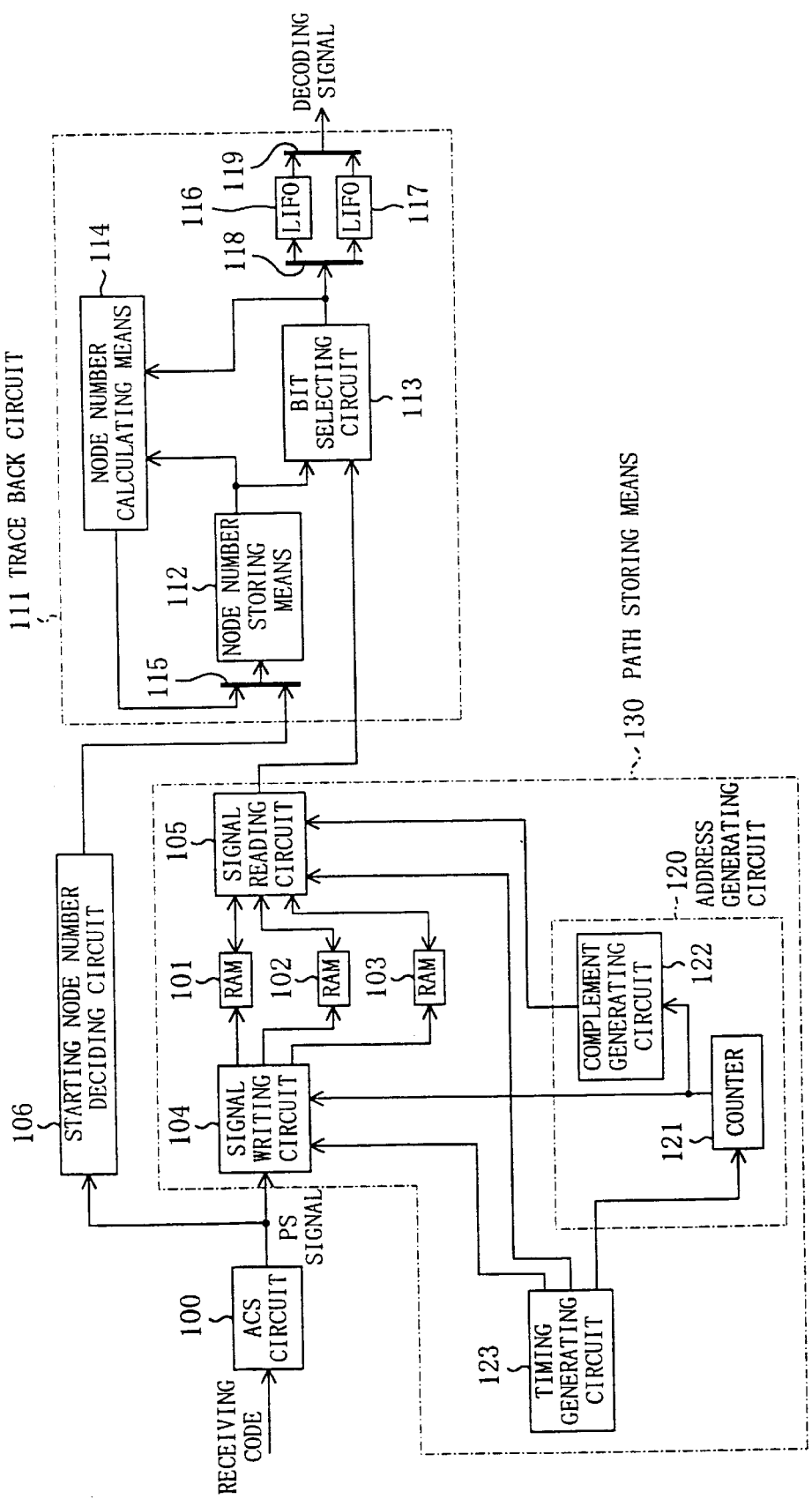
FIG. 1 shows in block a Viterbi decoder in accordance with a first embodiment of the present invention.

FIG. 1 is a block diagram of a Viterbi decoder in accordance with a first embodiment of this invention. In the present embodiment, m is the trace-back length, K the encoder constraint length, and f the symbol rate.

In FIG. 1, 100 is an add-compare-select (ACS) circuit for accepting received codes and providing path select (PS) signals. 101 is a first memory as a first storage unit. 102 is a second memory as a second storage unit. 103 is a third memory as a third storage unit. Each memory 101–103 is formed of a singleported RAM (random access memory), the data bit width of which being $2^{(K-1)}$ and the number of words of which being m. 104 is a signal writing circuit for selecting among first to third memories 101–103 and for writing PS signals generated in ACS circuit 100 into a selected memory. 105 is a signal reading circuit for selecting among first to third memories 101–103 and for reading PS signals from a selected memory.

Referring still to FIG. 1, 106 is a starting node number deciding circuit. This circuit 106 inputs PS signals from ACS circuit 100 and determines the starting node number of a most likely path. The internal structure of starting node number deciding circuit 106 varies with the encoder constraint length K. The internal structure and operation of starting node number deciding circuit 106 is described later in detail.

111 is a trace-back circuit. Trace-back circuit 111 inputs a most likely path starting node number from starting node number deciding circuit 106 and a PS signal from signal reading circuit 105, and performs a trace-back operation for signal decoding. Trace-back circuit 111 includes a node number storing means 112, a bit selecting means 113 which inputs the output data from node number storing means 112 and selects and provides specific bits of a PS signal from signal reading circuit 105, a node number calculating means 114 which inputs output bits from bit selecting circuit 113 and data stored in node number storing means 112 and calculates a node number one symbol before, and a selecting means 115 which inputs both the output data from starting node number deciding circuit 106 and the output data from node number calculating means 114 and selects one of the output data from starting node number deciding circuit 106 and the output data from node number calculating means 114 for forwarding to node number storing means 112. Node number storing means 112, bit selecting circuit 113, node number calculating means 114, and selecting means 115 together constitute a decoding circuit.

116 is a first LIFO (last-in-first-out) memory. 117 is a second LIFO memory. 118 is a first selecting means for feeding the output bit from bit selecting circuit 113 to LIFO memory 116 or to LIFO memory 117. 119 is a second selecting means for selecting the output data from LIFO memory 116 or LIFO memory 117, whichever is not selected by first selecting means 118, to provide the selected output data.

120 is an address generating circuit for generating read and write addresses of first to third memories 101–103 to signal writing circuit 104 or to signal reading circuit 105. 123 is a timing generating circuit for controlling the entire decoder. Address generating circuit 120 includes a counter 121 for counting the number of clock signals from timing generating circuit 123 (in synchronism with the timing of the input of received codes) at a cycle of m, and a complement generating circuit 122 for generating a complement on (m−1) with respect to the counting data of counter 121.

First to third memories 101–103, signal writing circuit 104, signal reading circuit 105, address generating circuit 120, and timing generating circuit 123 together form a path storing means 130.

Figure 2:
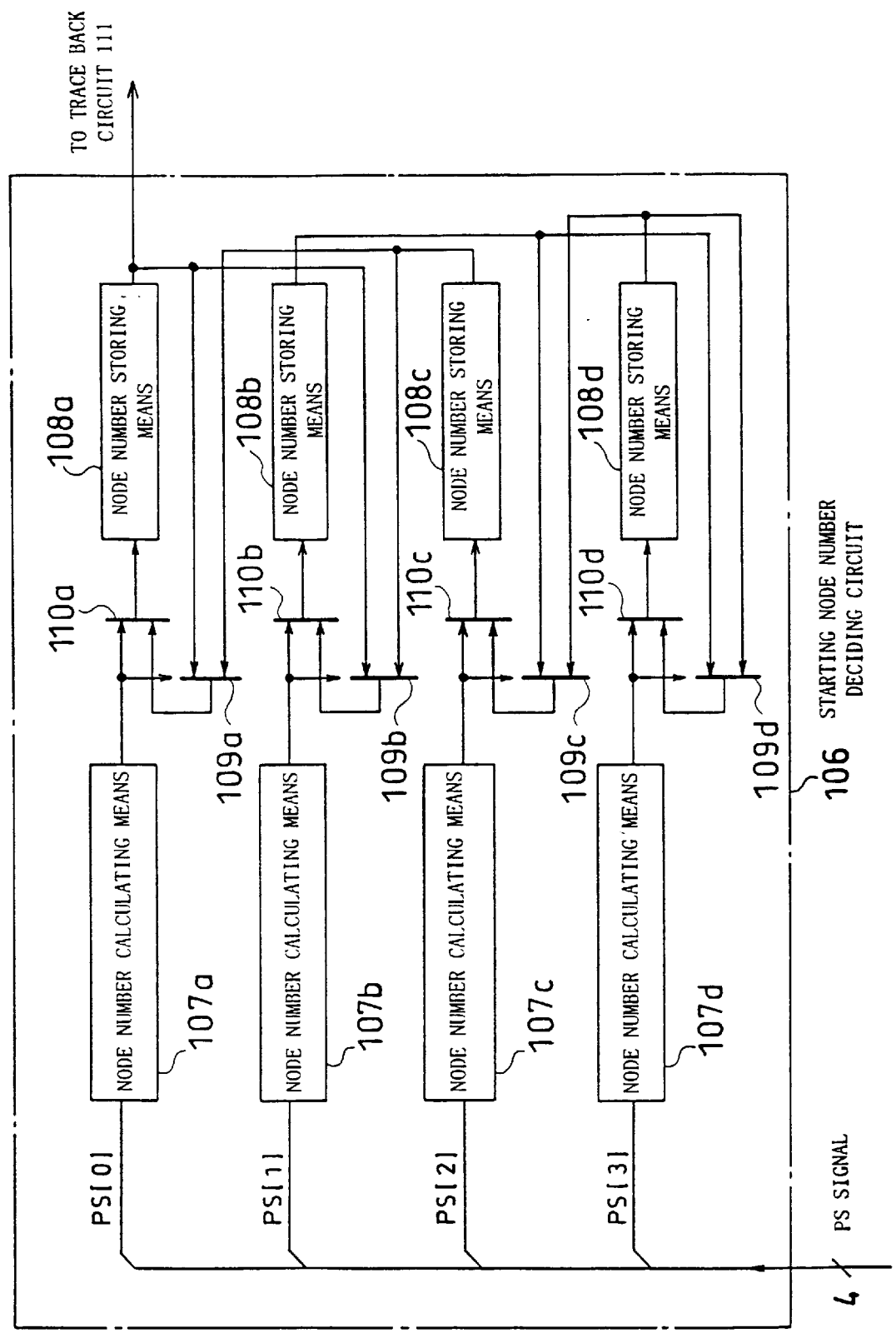
FIG. 2 shows in block form a starting node number deciding circuit of the Viterbi decoder in FIG. 1.

FIG. 2 is a block diagram showing the internal structure of starting node number deciding circuit 106. In starting node number deciding circuit 106, a node deciding circuit, comprised of a node number calculating means, a node number storing means, a first selecting means, and a second selecting means, is provided to a respective bit of a PS signal from ACS circuit 100. $2^{(K-1)}$ node deciding circuits are arranged within starting node number deciding circuit 106, for the number of bits of a PS signal is $2^{(K-1)}$. FIG. 2 shows a case for K=3. Four (=$2^2$) node number calculating means 107a–d, four node number storing means 108a–d, four first selecting means 109a–d, and four second selecting means 110a–d are provided.

The operation of the above-described Viterbi decoder is now described below.

Figures 3A, 3B:
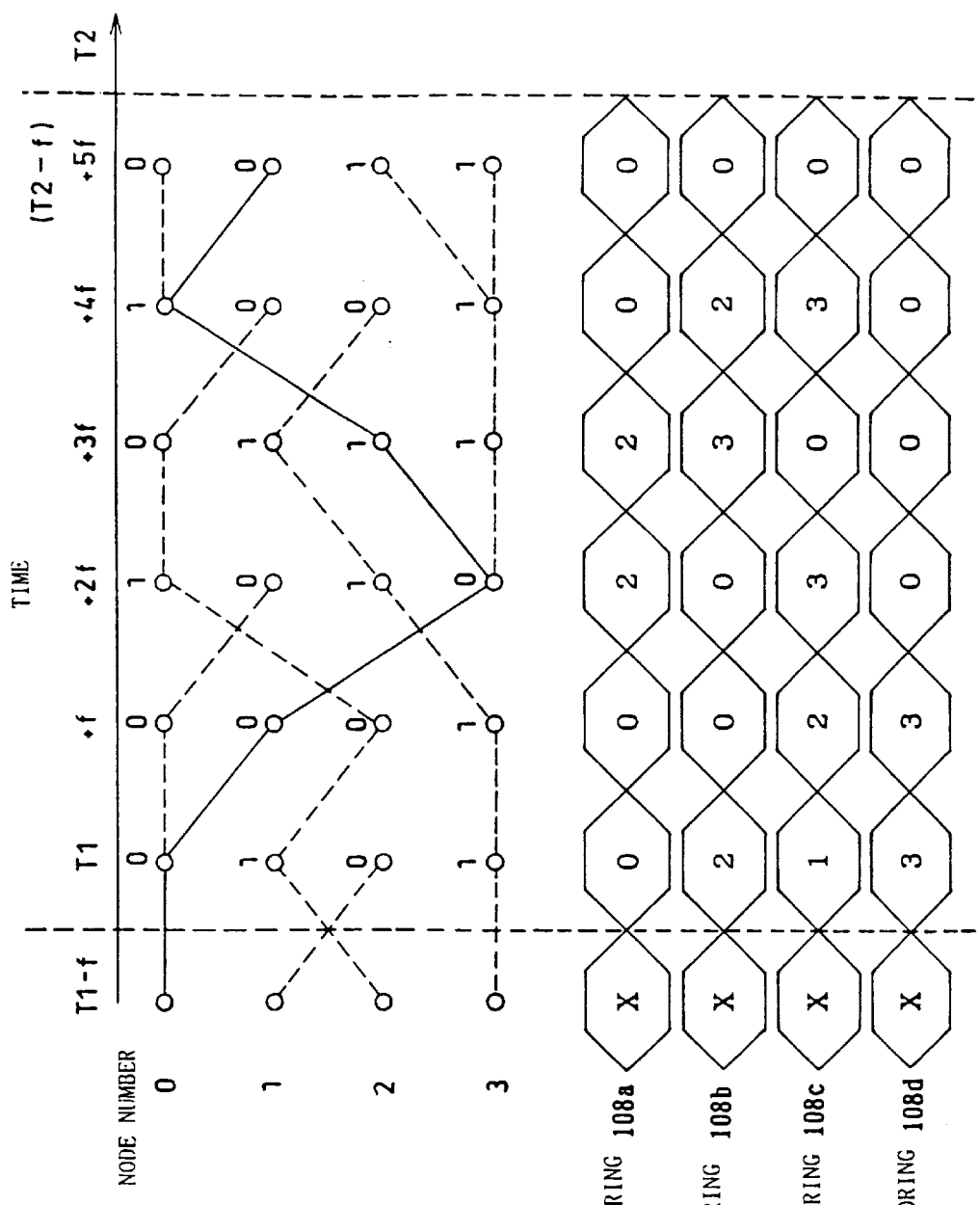
FIG. 3(a) is a trellis diagram showing a most likely path and path select (PS) signals and FIG. 3(b) is a diagram showing changes in the data of a node number storing means in the trellis diagram of FIG. 3(a).

The operation of starting node number deciding circuit 106 is first described. FIG. 3 is a diagram for describing the operation of starting node number deciding circuit 106 shown in FIG. 2. FIG. 3 (a) is a trellis diagram showing PS signals at respective times and a most likely path in which the PS signals are numbered at their shoulders and the most likely path is indicated by a solid line. FIG. 3(b) is a diagram showing the contents of each node number storing means 108a–d at the respective times.

As described previously, if the PS signal at node i is PSi, then a node number j, through which the most likely path passed one symbol earlier in time, is given by:

$$j = PSi \cdot 2^{(K-2)} + [i/2] \quad \ldots \text{(Equation 1)}$$

where [x] is the largest integer not in excess of x. Each of node number calculating means 107a–d performs Equation (1) on its corresponding node.

At time T1, the output data from node number calculating means 107a–d are {0, 2, 1, 3} because the PS signals at their corresponding nodes 0–3 are {0, 1, 0, 1}, and each output data is indicative of the number of a predecessor node through which each path arriving at its respective node at time T1 passed at time (T1−f). At this time, selecting means 110a–d supply the output data from node number calculating means 107a–d, to node number storing means 108a–d.

At time (T1+f), the output data from node number calculating means 107a–d are {0, 0, 1, 3} because the PS signals at their corresponding nodes 0–3 are {0, 0, 0, 1}, and each output data of the node number calculating means 107a–b is indicative of the number of a predecessor node through which each path arriving at its respective node at time (T1+f) passed at time T1. At this point in time, first selecting means 109a–d each select, according to the output data from node number calculating means 107a–d, one of node number storing means 108a–d and thereafter provide the data stored in the selected node number storing means 108. Second selecting means 110a–d, instead of selecting the output data from node number calculating means 107a–d, choose the output data from first selecting means 109a–d for forwarding to node number storing means 108a–d.

Here, first selecting means 109a–d each select node number storing means 108 corresponding to a node that is assigned a node number indicated by the output data from node number calculating means 107. For example, node number calculating means 107a gives an output of "0" and, therefore, first selecting means 109a selects and provides the data stored in node number storing means 108a corresponding to node 0. Node number storing means 108a is fed "0" because the data, stored at time T1 in node number storing means 108a, is "0".

Additionally, node number calculating means 107c gives an output of "1" and, therefore, first selecting means 109c selects and provides the data stored in node number storing means 108b corresponding to node 1. Node number storing means 108c is fed "2" because the data, stored at time T1 in node number storing means 108b, is "2".

In a way described above, the stored data items of node number storing means 108a–d are updated from {0, 2, 1, 3} to {0, 0, 2, 3}. Each data item is indicative of the number of a predecessor node through which each path arriving at its respective node at time (T1+f) passed at time (T1−f).

Likewise, the stored data of node number storing means 108a–d are updated for every elapse of time f. At time (T1+5f), node number storing means 108a–d each come to store "0" and thereby agree. This shows that the most likely path which passed through node 0 at time (T1−f) becomes detectable at time (T1+5f). Taking a sufficiently great traceback length (m) makes it possible to read PS signals and to find the number of a predecessor node through which the most likely path has passed a period of time (m−1)f earlier.

To sum up, the present embodiment is characterized in that, at the same time that PS signals are read in, the numbers of the nodes through which the most likely path passes can be detected by means of starting node number deciding circuit 106.

Figures 4A, 4B:
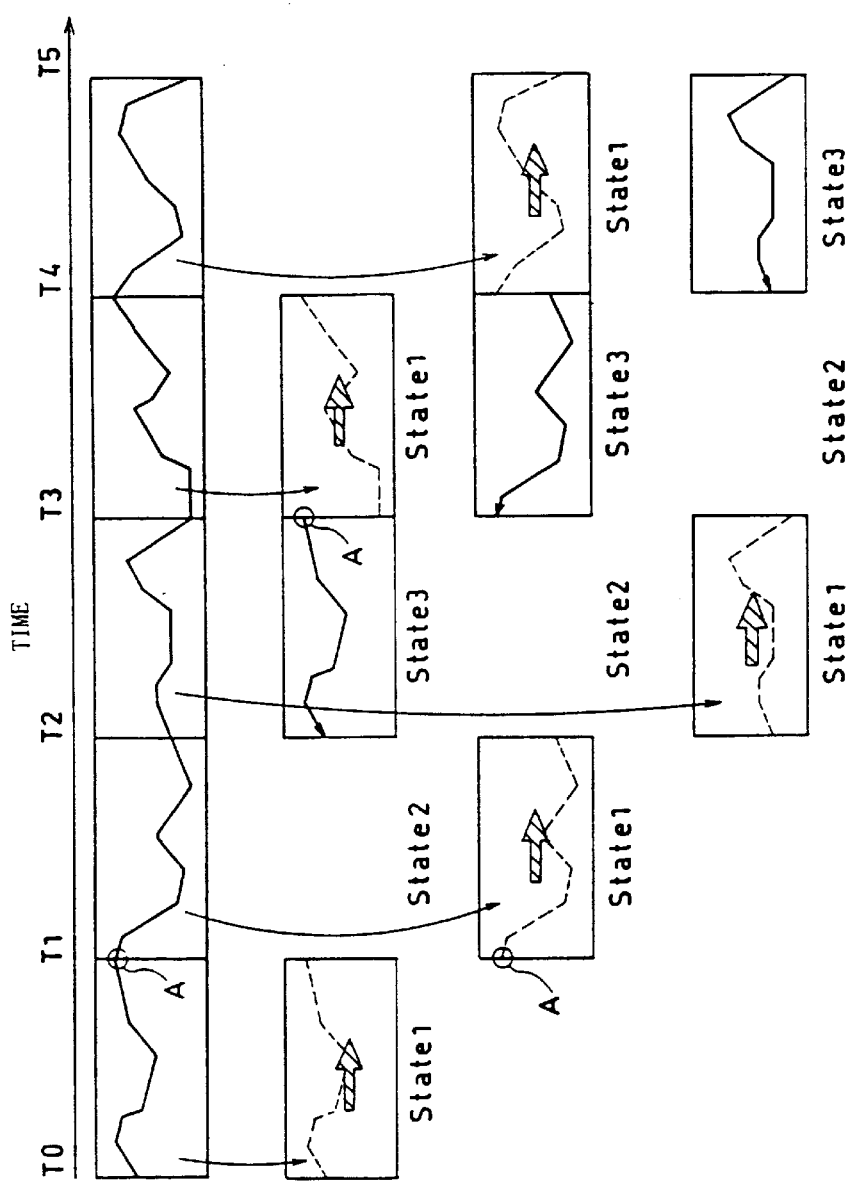
FIG. 4 a diagram showing details of the operation of the Viterbi decoder in FIG. 1.

With reference now to FIG. 4, the operation of the Viterbi decoder of FIG. 1 is now described. ACS circuit 100 of the present embodiment operates in the same way that a conventional ACS circuit does. Suppose that PS signals together forming a most likely path as shown by a solid line of FIG. 4(a) are outputted from ACS circuit 100 in the period from time T0 to time T5.

As can be seen from FIG. 4(b), each memory 101–103 cyclically and repeatedly is placed in three different operating states, State1, State2, and State3. For example, for the case of first memory 101, it is in the State1 in the period from time T0 to time T1, in the State2 in the period from time T1 to time T2, and in the State3 in the period from time T2 to time T3. Second memory 102 sequentially changes to the State1, to the State2, and to the State3 from time T1. Third memory 103 changes to the State1, to the State2, and to the State3 in sequence from time T2. The state-to-state time interval is m (the trace-back length)×f (the symbol rate).

Counter 121 in address generating circuit 120 counts the number of clock signals produced in timing generating circuit 123 per f (the symbol rate) at a cycle of m. The count value of counter 121 is 0 at time T0.

In the period from time T0 to time T1, first memory 101 is placed in the State1, and PS signals generated in ACS circuit 100 are written by signal writing circuit 104 into first memory 101. Using the count value of counter 121 as a write address, PS signals are sequentially written to at addresses #0 to #(m−1) of first memory 101.

In the period from time T1 to T2, first memory 101 is placed in the State2 therefore being inoperative. The reason of why the PS signal written in first memory 101 cannot be traced back at this time is that, at this point in time, the starting node number A, i.e., the terminal node number of the most likely path from time T0 to time T1, cannot yet have been determined.

Instead, second memory 102 enters the State1 and PS signals are sequentially written to at addresses #0 to #(m−1) of second memory 102. At the same time, PS signals are sequentially fed, also to starting node number deciding circuit 106. As previously explained, the number of the node, through which the most likely path passes at time (T1−f), has been stored in node number storing means 108a–d at time (T2−f). This node number indicates the starting node number A of the most likely path indicated by the PS signals written to first memory 101. Accordingly, in the operation of the State1, at the same time that PS signals are written into a memory, it is possible to detect the starting node number A of a most likely path indicated by predecessor PS signals written into a different memory.

In the period from time T2 to time T3, second memory 102 is placed in the State2 therefore being inoperative. Instead, third memory 103 is placed in the State1, and PS signals are sequentially written to at addresses #0 to #(m−1). First memory 101 is placed in the State3, and a trace-back operation starts from the starting node number A.

The trace-back operation of the State3 is now explained. Here, the constraint length K is three and the trace-back length m is six. Suppose that PS signals from time T1 to time (T1+5f) as shown in FIG. 3(a) are written into first memory 101, as PS signals from time T0 to time (T0+5f) for six symbols of FIG. 4(a).

The output data from complement generating circuit 122 is used as a read address. At time T2, the count value of counter 121 is 0 and, therefore, complement generating circuit 122 gives an output of five.

At time T2, the number of the node, stored in node number storing means 108a–d in starting node number deciding circuit 106, is fed to node number storing means 112 via selecting means 115 in trace-back circuit 111. This node number is the terminal node number of the most likely path between time T0 and time T1 (i.e., the starting node number A) and becomes one in the most likely path of FIG. 3(a). Bit selecting circuit 113 selects, from the data {0011} read from at address #5 of first memory 101 by signal reading circuit 105 (the data are the PS signals at time (T0+5f)), bit data corresponding to the node number stored in node number storing means 112 and provides the selected bit data. In such a case, the node number stored in node number storing means 112 is one and the second bit of the data {0011}, i.e., the bit "0", is provided from bit selecting circuit 113. In accordance with the principle of Viterbi decoding, this bit data, i.e., the PS signal at node 1 at time (T0+5f), becomes a decoded signal at time (T0+5f).

Node number calculating means 114 calculates, from the node number stored in node number storing means 112 and the decoded signal produced from bit selecting circuit 113, a node number one symbol earlier. Such a calculation is performed according to Equation (1) and the result of the calculation is supplied to node number storing means 112 through selecting means 115 at time (T2+f). The node number in this case is 0.

At time (T2+f), bit selecting circuit 113 selects, from the data {1001} read from at address #4 of first memory 101 by signal reading circuit 105, i.e., the PS signals at time (T0+4f), bit data corresponding to the node number stored in node number storing means 112, and provides the selected bit data. In such a case, the node number stored in node number storing means 112 is 0 and, therefore, the first bit of the data {1001}, i.e., the bit "1", is provided from bit selecting circuit 113 as a decoded signal. In the same procedure, decoding of the most likely path is carried out and a series of decoded signals {0, 1, 1, 0, 0, 0} is produced.

However, the decoding processing has been carried going back in time from time (T0+5f) to time T0. It is therefore required to time-reverse the obtained decoded signals, and trace-back circuit 111 is provided with a first LIFO memory 116 and a second LIFO memory 117.

In the period from time T2 to time T3, decoded signals from bit selecting circuit 113 are fed through selecting means 118 to first LIFO memory 116. Next, in the period from time T3 to time T4, decoded signals from bit selecting circuit 113 are fed through selecting means 118 to second LIFO memory 117 and, at the same time, the decoded signals are provided from LIFO memory 116 through selecting means 119. These decoded signals are ones in time-reversed relationship with the decoded signals from bit selecting circuit 113 and are {0, 0, 0, 1, 1, 0}. This bit string becomes true decoded signals.

As described above, in accordance with the present embodiment, a considerable reduction in trace-back memory storage capacity can be achieved. Additionally, a general-purpose RAM can be used as a trace-back memory thereby reducing the consumption of electric power. Forming a trace-back memory with three separate singleported memories makes it possible to cut of f every input to memory in the inoperative state (i.e., the State2) such as the input of clock signals. A further power reduction can be achieved. Complete pipelining is possible thereby providing high-speed operation.

In the present embodiment, three singleported memories are employed. However, a trace-back memory, implemented by dividing a multiported memory whose storage capacity is equal to the total storage capacity of the aforesaid three singleported memories, may be used.

Second Embodiment

Figure 5:
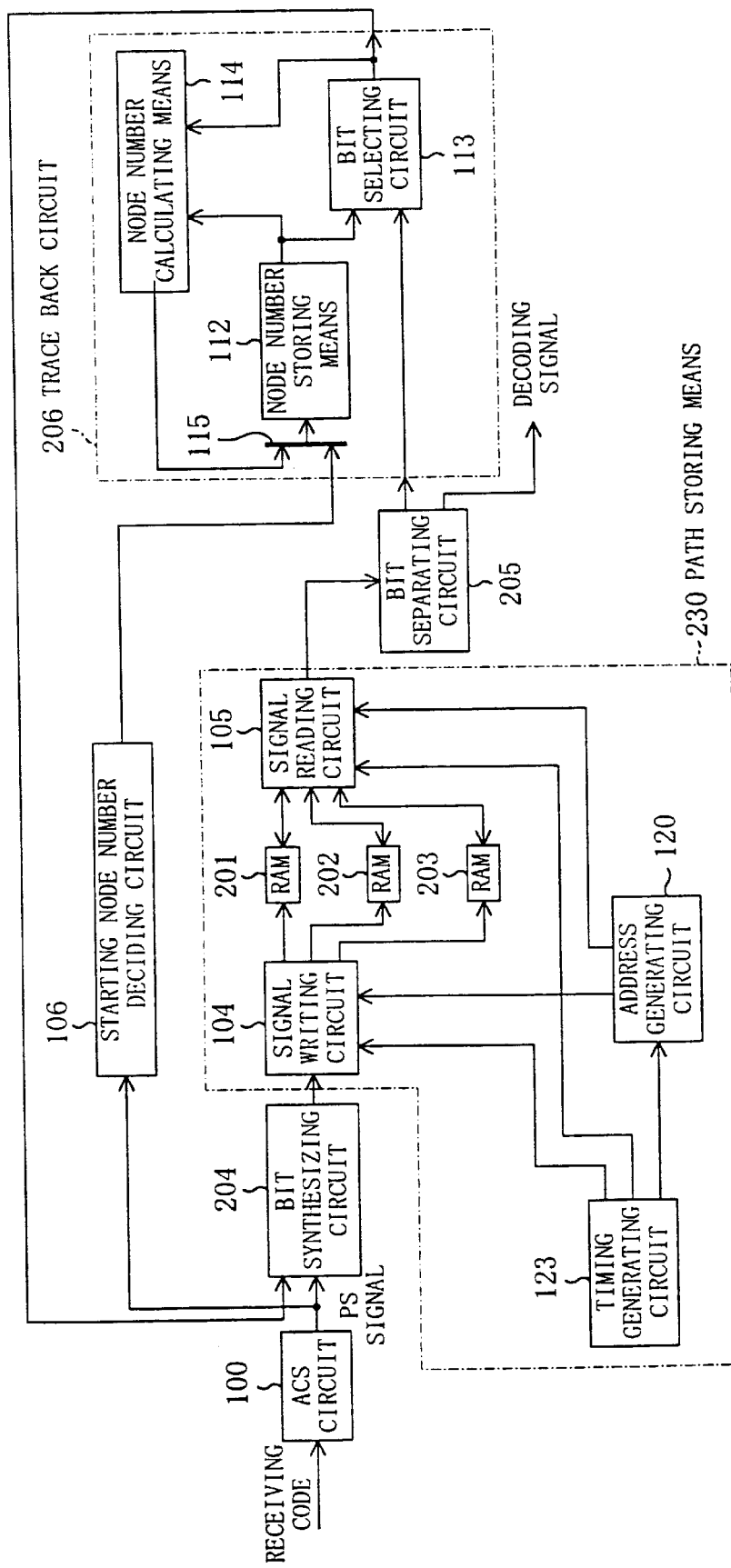
FIG. 5 shows in block for a Viterbi decoder in accordance with a second embodiment of the present invention.

FIG. 5 is a block diagram of a Viterbi decoder in accordance with a second embodiment of the present invention. As in the first embodiment, m is the trace-back length, K the encoder constraint length, and f the symbol rate.

In FIGS. 1 and 5 respectively showing the first embodiment Viterbi decoder and the second embodiment Viterbi decoder, like reference numerals have been used to indicate like elements, and they are not described here. 201 is a first memory as a first storage unit. 202 is a second memory as a second storage unit. 203 is a third memory as a third storage unit. Each memory 201–203 is formed of a single-ported RAM, the data bit width of which being $(2^{(K-1)}+1)$ which is greater by one bit than that of each memory of the first embodiment Viterbi decoder and the number of words of which being m.

First to third memories 201–203, signal writing circuit 104, signal reading circuit 105, address generating circuit 120, and timing generating circuit 123 together constitute path storing means 230.

204 is a bit synthesizing circuit for combining an output signal from trace-back circuit 206 which is described later with a PS signal from ACS circuit 100. 205 is a bit separating circuit for the separation of a bit corresponding to a decoded signal from an output signal from signal reading circuit 105 and the remaining bits are sent to trace-back circuit 206. By bit synthesizing circuit 204 and signal writing circuit 104, a PS signal from ACS circuit 100 and a decoded signal from trace-back circuit 203 are combined together and written to a selected memory. By signal reading circuit 105 and bit separating circuit 205, a signal is read from a selected memory and is divided into a PS signal and a decoded signal.

Trace-back circuit 206 is a circuit for receiving the starting node number of the most likely path from starting node number deciding circuit 106 and the output signal of bit separating circuit 205 to perform a trace-back operation for signal decoding. This trace-back circuit 206 is made up of node number storing means 112, bit selecting circuit 113, node number calculating means 114, and selecting means 115. Unlike trace-back circuit 115 in FIG. 1, none of LIFO memory 116, second LIFO memory 117, selecting means 118, and selecting means 119 are provided in trace-back circuit 206 of the present embodiment, and the output signal from bit selecting circuit 113 is fed to bit synthesizing circuit 204.

The operation of the above-described Viterbi decoder is now described below.

Figures 6A, 6B:
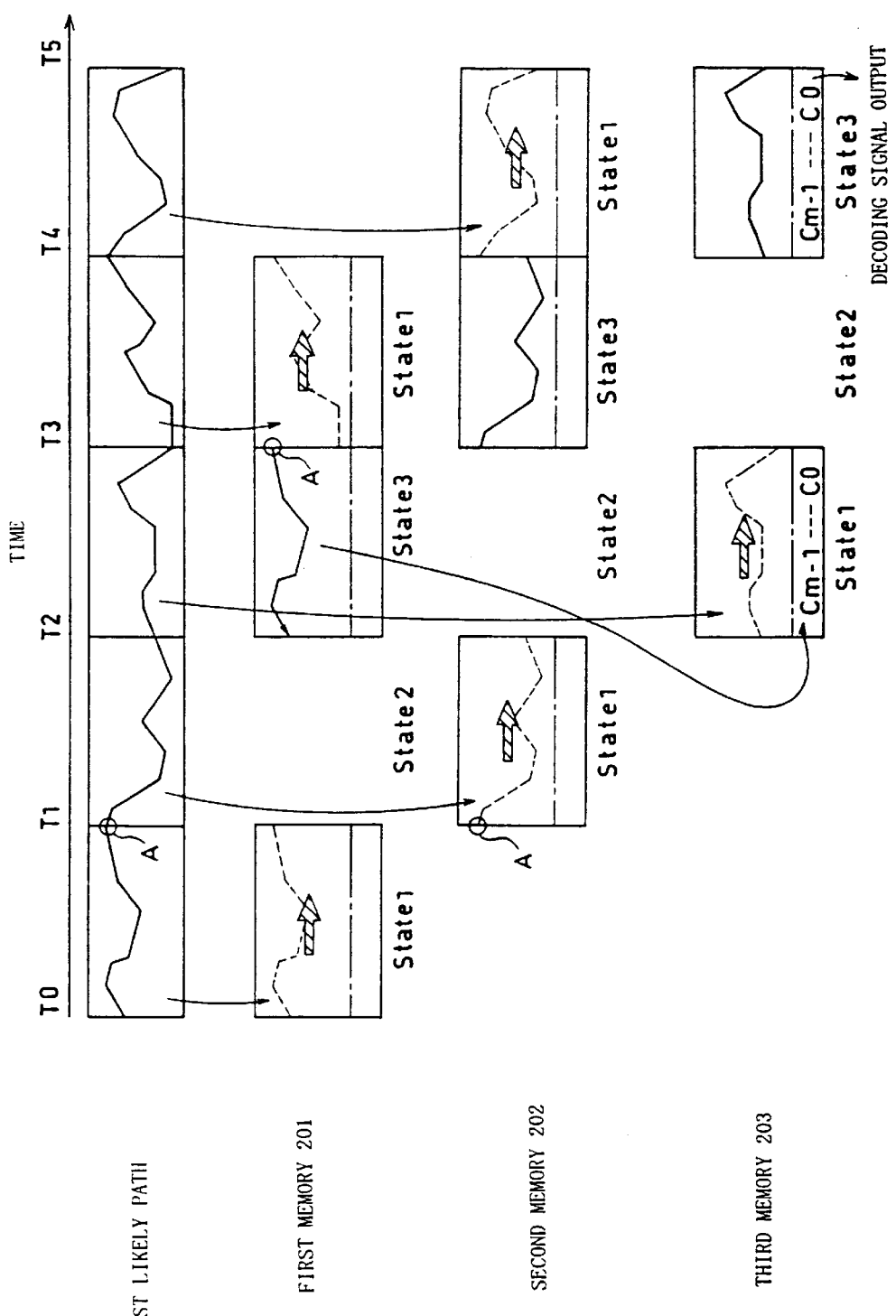
FIG. 6 is diagram showing details of the operation of the Viterbi decoder in FIG. 5.

The operation of the Viterbi decoder shown in FIG. 5 is described by FIG. 6. FIG. 6(a) illustrates a most likely path formed by input received codes. FIG. 6(b) illustrates the operating states of first to third memories 201–203 at respective times.

Suppose that PS signals forming a most likely path as shown in FIG. 6(a) are provided from ACS circuit 100 from time T0 to time T5. As in the first embodiment, each memory 201–203 cyclically and repeatedly enters three different states (the State1, the State2, the State3) as shown by FIG. 6(b).

The present embodiment differs from the first embodiment in that decoded signals, obtained by the trace-back operation of the State3, are stored in a free area of a trace-back memory in the State1. The stored decoded signals are time-reversed and are provided in the State3.

Figure 7:
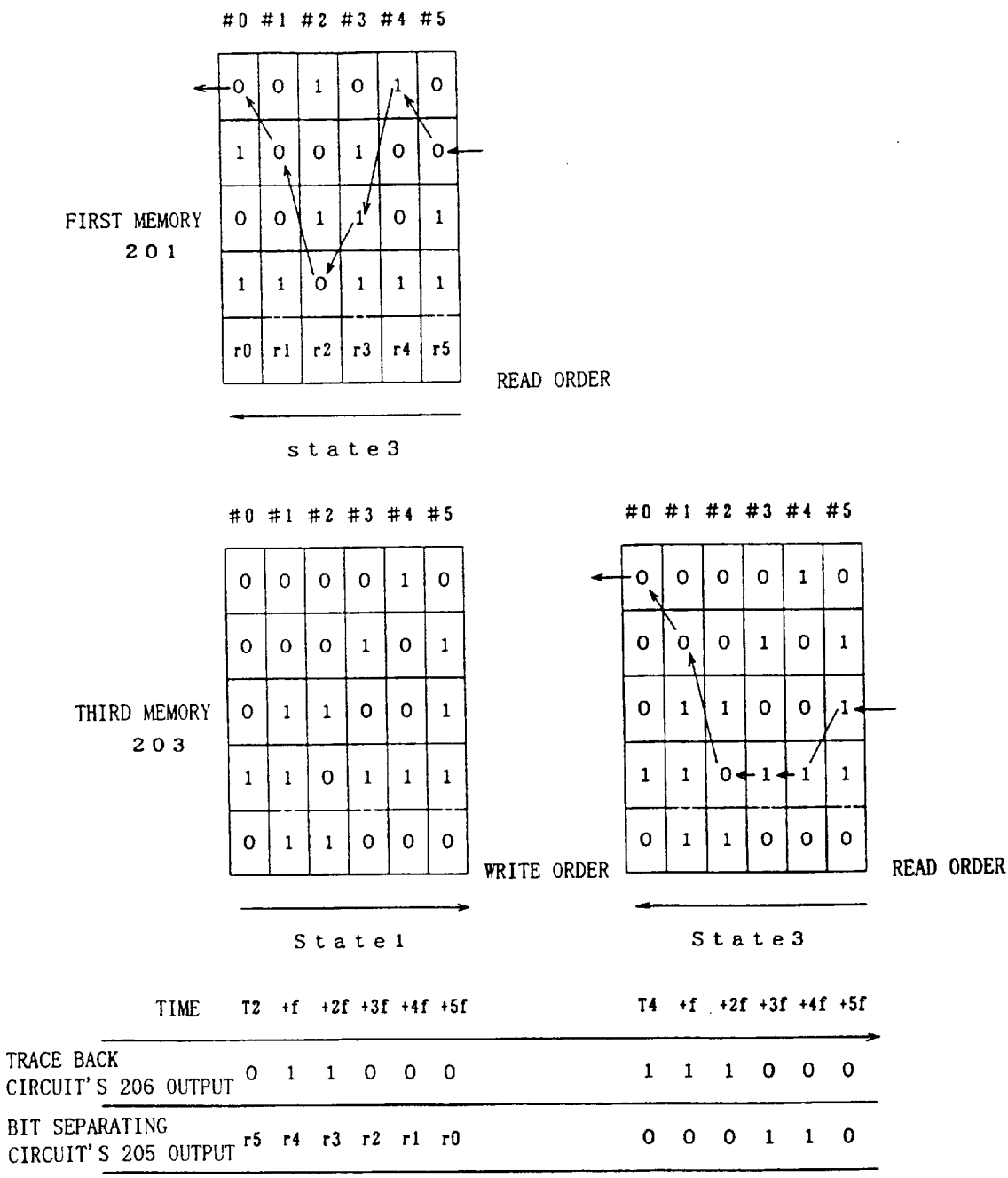
FIG. 7 is a diagram showing details of the operation of the Viterbi decoder of FIG. 5.

A mechanism of time-reversing decoded signals is explained in detail with reference to FIG. 7. Suppose that PS signals are already written in first memory 201 in the State1 from time T0.

First memory 201 enters the State3 from time T2 and trace-back operation is carried out in the same manner as in the first embodiment. The most likely path is shown by a solid line in the figure. At time T2, a PS signal is selected and provided from at address #5 by trace-back circuit 206 as a decoded signal, according to the starting node number generated from starting node number deciding circuit 106. Here, the starting node number is one, and a "0" is provided serving as a decoded signal.

Unlike the trace-back circuit of the first embodiment, trace-back circuit 206 of the present embodiment is not provided with an LIFO memory and the output signal from bit selecting circuit 113 is provided intact from trace-back circuit 206. This output signal of bit selecting circuit 113 is applied to bit synthesizing circuit 204. In bit synthesizing circuit 204, the output signal is combined with a PS signal from ACS circuit 100 and is then written to at address #0 of third memory 203 in the State1. The PS signal at this time is {0, 0, 0, 1} and the decoded signal is "0". As a result, accordingly, {0, 0, 0, 1, 0} is written to at address #0 of third memory 203.

Next, at time (T2+f), a decoded signal is read out from at address #4 of first memory 201 for writing to at address #1 of third memory 203. Such operations are sequentially repeated until time (T2+5f), whereby the output of trace-back circuit 206 (i.e., the decoded signals obtained by trace-back of first memory 201) is written to specific bits of third memory 203 at the bottom in FIG. 7. Here, the decoded signals produced are {0, 1, 1, 0, 0, 0}.

Third memory 203 enters the State3 from time T4 and a trace-back operation is carried out. At this time, specific bits, in which decoded signals are written in the State1, are separated from data read out by signal reading circuit 105 from at address #5, to be produced as a decoded signal. As a result, the decoded signals are read out in an opposite order to that in which they were written to third memory 203, therefore being {0, 0, 0, 1, 1, 0}. This signal string becomes true decoded signals.

As described above, the present embodiment eliminates the need for placing circuits such as LIFO memory for the correcting of decoded signal time-relationship in the trace-back circuit. Additionally, the time relationship may be corrected by the usual operation of the trace-back memory, which makes it possible to achieve a considerable reduction of the circuit size because no special control circuits are needed.

As in the first embodiment, three singleported memories are used in the present embodiment. However, a trace-back memory, implemented by dividing a multiported memory whose storage capacity is equal to the total storage capacity of the aforesaid three singleported memories, may be used.

The bit width of each memory in the present embodiment is greater by one than in the first embodiment. The reason is that the number of bits of the decoded signal is one. However, the memory bit width may be increased with the number of decoded signal bits.

Third Embodiment

Figure 8:
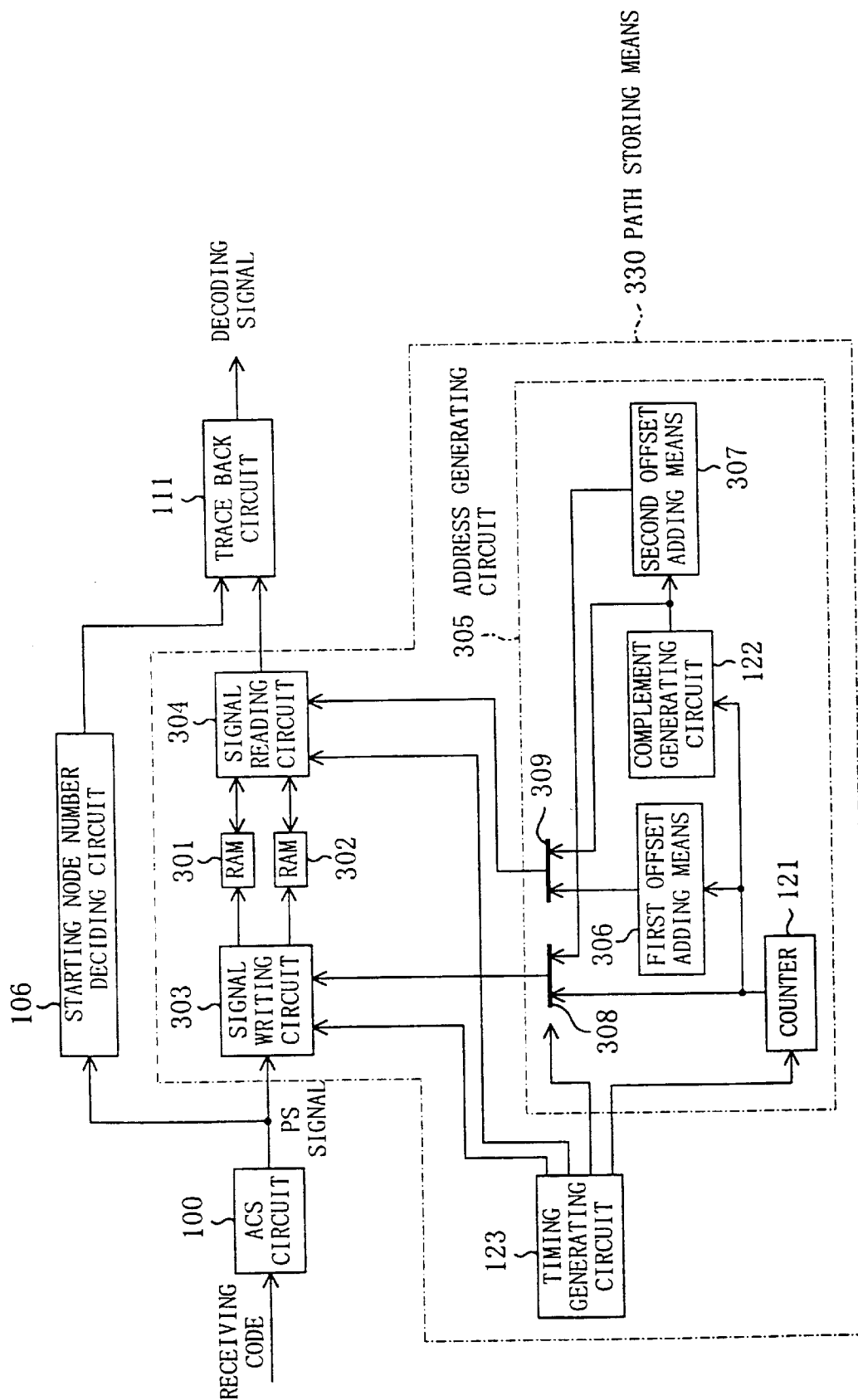
FIG. 8 shows in block form a Viterbi decoder in accordance with a third embodiment of the present invention.

FIG. 8 is a block diagram of a Viterbi decoder in accordance with a third embodiment of the present invention. As in the first and second embodiments, m is the trace-back length, and K the encoder constraint length, and f the symbol rate.

In FIGS. 1 and 8 respectively showing the first embodiment Viterbi decoder and the third embodiment Viterbi decoder, like reference numerals have been used to indicate like elements, and they are not described here. 301 is a first memory as a first storage unit. 302 is a second memory as a second storage unit. Each memory 301 and 302 is formed by a multiported RAM, the data bit width of which being $2^{(K-1)}$ and the number of words of which being (m+1) which is greater by one word than each memory of the first and second embodiments. 303 is a signal writing circuit for selecting between first memory 301 and second memory 302 and for writing PS signals from ACS circuit 100 into first memory 301 or second memory 302, whichever is selected. 304 is a signal reading circuit for selecting between first memory 301 and second memory 302 and for obtaining PS signals out of first memory 301 or second memory 302, whichever is selected. 305 is an address generating circuit for generating write and read addresses of first and second memories 301 and 302 to signal writing circuit 303 or to signal reading circuit 304. Address generating circuit 305 includes, in addition to m-cycle counter 121 and complement generating circuit 122, a first offset adding means 306 for the adding of one to the count value of counter 121, a second offset adding means for the adding of one to the output data of complement generating circuit 122, a first selecting means 308 for selecting between the count value of counter 121 and the output data of second offset adding means 307 for forwarding to signal writing circuit 303, and a second selecting means 309 for selecting between the output data of first offset adding means 306 and the output data of complement generating circuit 122 for forwarding to signal reading circuit 304. Both the operation of first selecting means 308 and the operation of second selecting means 309 are controlled by timing generating circuit 123 in charge of controlling the operating timing of the entire decoder.

First memory 301, second memory 302, signal writing circuit 303, signal reading circuit 304, timing generating circuit 123, and address generating circuit 305 together form a path storing means 330.

The operation of the above-described Viterbi decoder is now described. The present embodiment is characterized in that trace-back processing and PS signal writing are carried out in parallel.

Figure 9:
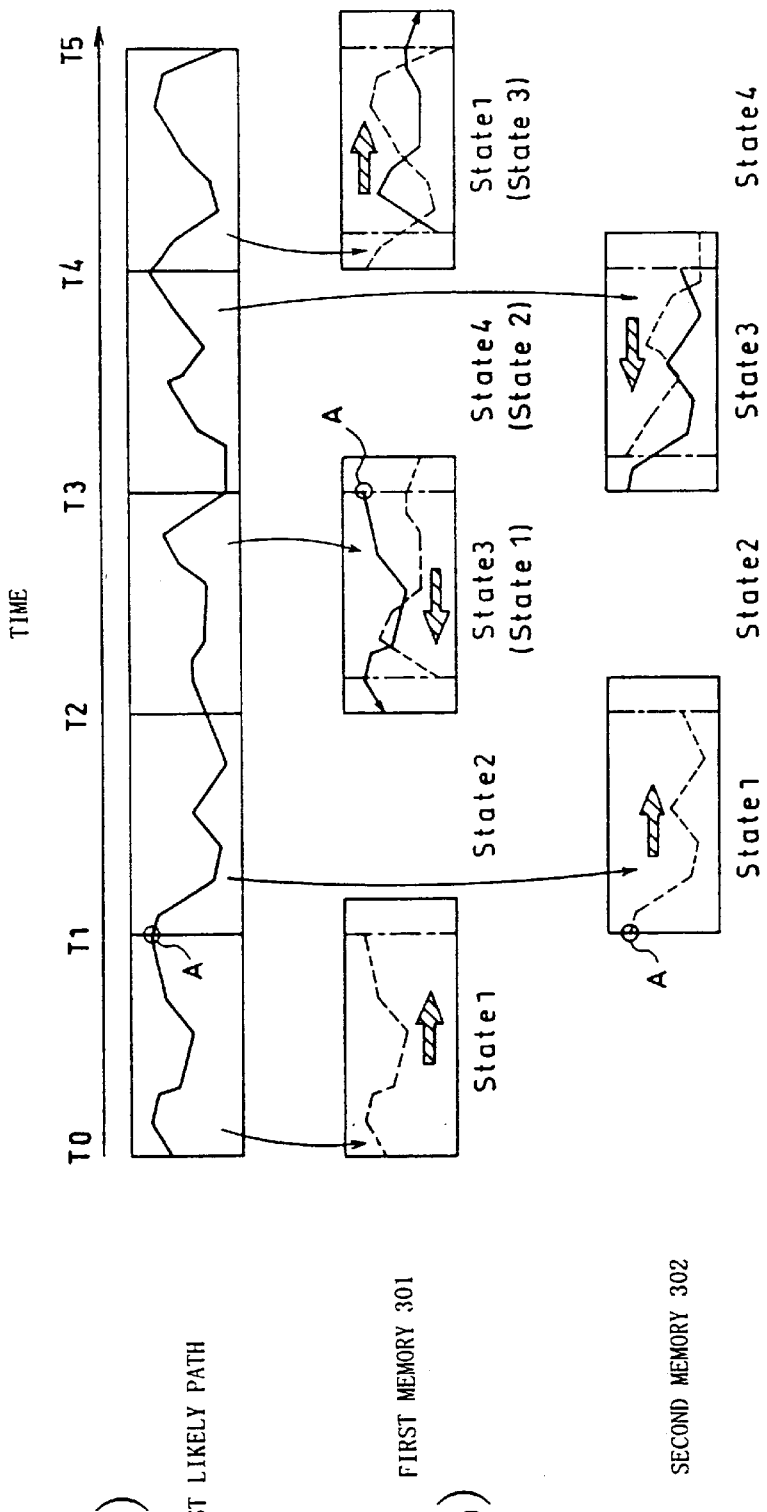
FIG. 9 is a diagram showing details of the operation of the Viterbi decoder in FIG. 8.

Referring now to FIG. 9, the operation of the Viterbi decoder of FIG. 8 is described. FIG. 9(a) is a trellis diagram showing a most likely path formed by input received codes. FIG. 9(b) is a diagram showing the operating states of first and second memories 301 and 302 at respective times.

Suppose here that PS signals forming the most likely path as shown in FIG. 9(a), are produced from ACS circuit 100 from time T0 to time T5. At this time, each first and second memory 301 and 302 cyclically and repeatedly enters four different states (the State1 to State4) as shown in FIG. 9(b). In FIG. 9(b), each hatched arrow indicates the direction in which each memory is accessed.

Figure 10:
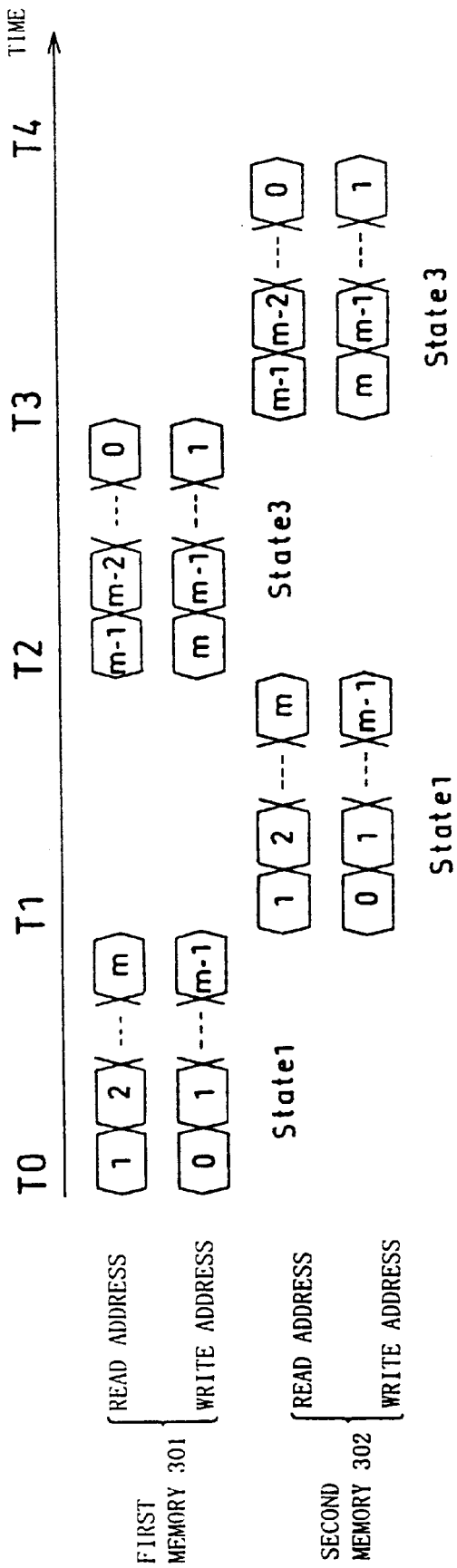
FIG. 10 is a diagram showing details of the operation of the Viterbi decoder in FIG. 8.

FIG. 10 is a diagram showing read and write addresses in the respective states. As shown in FIG. 10, when the memory is in the State1, first selecting means 308 selects, as a write address, the count data of counter 121, while second selecting means 309 selects, as a read address, the output data of first offset adding means 306 (the offset value is one in FIG. 10). Additionally, when the memory is in the State3, second selecting means 309 selects, as a read address, the output data of complement generating circuit 122, while first selecting means 308 selects, as a write address, the output data of second offset adding means 307 (the offset value is one in FIG. 10).

In the period from time T0 to time T1, first memory 301 is placed in the State1, and PS signals from ACS circuit 100 are written to first memory 301. At this time, the count value of counter 121 is selected as a write address by first selecting means 308, and PS signals are sequentially written to at addresses #0 to #(m−1) of first memory 301.

In the period from time T1 to time T2, first memory 301 is placed in the State2 therefore being inoperative. Instead, second memory 302 enters the State1, and as in the State1 of first memory 301, PS signals from ACS circuit 100 are sequentially written to at addresses #0 to #(m−1) of second memory 302 wherein the count value of counter 121 selected by first selecting means 308 is used as write address. At this time, as in the first embodiment, the terminal node number of a most likely path formed of the PS signals written into first memory 301 is detected at time (T2−f) by the operation of starting node number deciding circuit 106. The PS signal at the terminal node has been stored at address #(m−1) of first memory 301.

In the period from time T2 to time T3, first memory 301 is placed in the State3 and trace-back operation is carried out as in the first embodiment. At this time, second selecting means 309 selects, as read address, the output data of complement generating circuit 122, and PS signals, stored at addresses #(m−1) to #0 of first memory 301, are sequentially read out, and trace-back operation is carried out by the operation of trace-back circuit 111, and decoded signals are provided.

Additionally, at this time, using the output data of second offset adding means 307 selected by first selecting means 308 as write address, PS signals from ACS circuit 100 are written in first memory 301. In other words, in the State3 of the present embodiment, trace-back processing and PS signal writing are carried out in parallel. The write address is always greater than the read address by one because second offset adding means 307 performs an operation of adding an offset value (one in this case) to the output data of complement generating circuit 122 and provides the result of the adding operation. As a result, new PS signals are sequentially written to at addresses #m to #1 of first memory 301, therefore producing no obstacles to the operation of trace-back starting with address #(m−1).

Next, in the period from time T3 to time T4, first memory 301 is placed in the State4 therefore being inoperative. Instead, second memory 302 enters the State3 and, as in the State3 of first memory 301, the writing of new PS signals is carried out in parallel with the operation of trace-back. Using the output data of complement generating circuit 122 selected by second selecting means 309 as read address, PS signals at addresses #(m−1) to #0 are sequentially read out and trace-back operation is carried out. Concurrently with this, using the output data of second offset adding means 307 selected by first selecting means 308 as write address, new PS signals are sequentially written to at addresses #m to #1.

In the period from time T4 to time T5, first memory 301 is replaced in the State1 and PS signals are sequentially written to at addresses #0 to #(m−1) of first memory 301. However, first memory 301 has already been written at addresses #m to #1 with the predecessor PS signals in the State3. Accordingly, these predecessor PS signals are traced back concurrently with the writing of the new PS signals. The terminal node number of the most likely path formed by the already-written PS signals was already detected at time (T4−f), and the PS signal at the terminal node has been stored at address #1 of first memory 301. Therefore, a trace-back operation is carried out from address #1 to address #m in sequence.

Thereafter, the like operations are repeated to perform decoding processing. In the State3, the operation of the State1 for a subsequent trace-back operation is carried out at the same time, in other words, substantially, two states are repeated with respect to each memory 301 and 302.

Such arrangement makes it possible to efficiently use trace-back memory by the setting of offset values to read and write addresses and by continuously writing new PS signals to at read-completed addresses. This achieves a considerable reduction of the memory storage capacity.

The present embodiment employs the structure in which separate multiported memories are used. However, a single multiported memory whose storage capacity is equal to the total storage capacity of the two multiported memories may be used divisionally.

Fourth Embodiment

Figure 11:
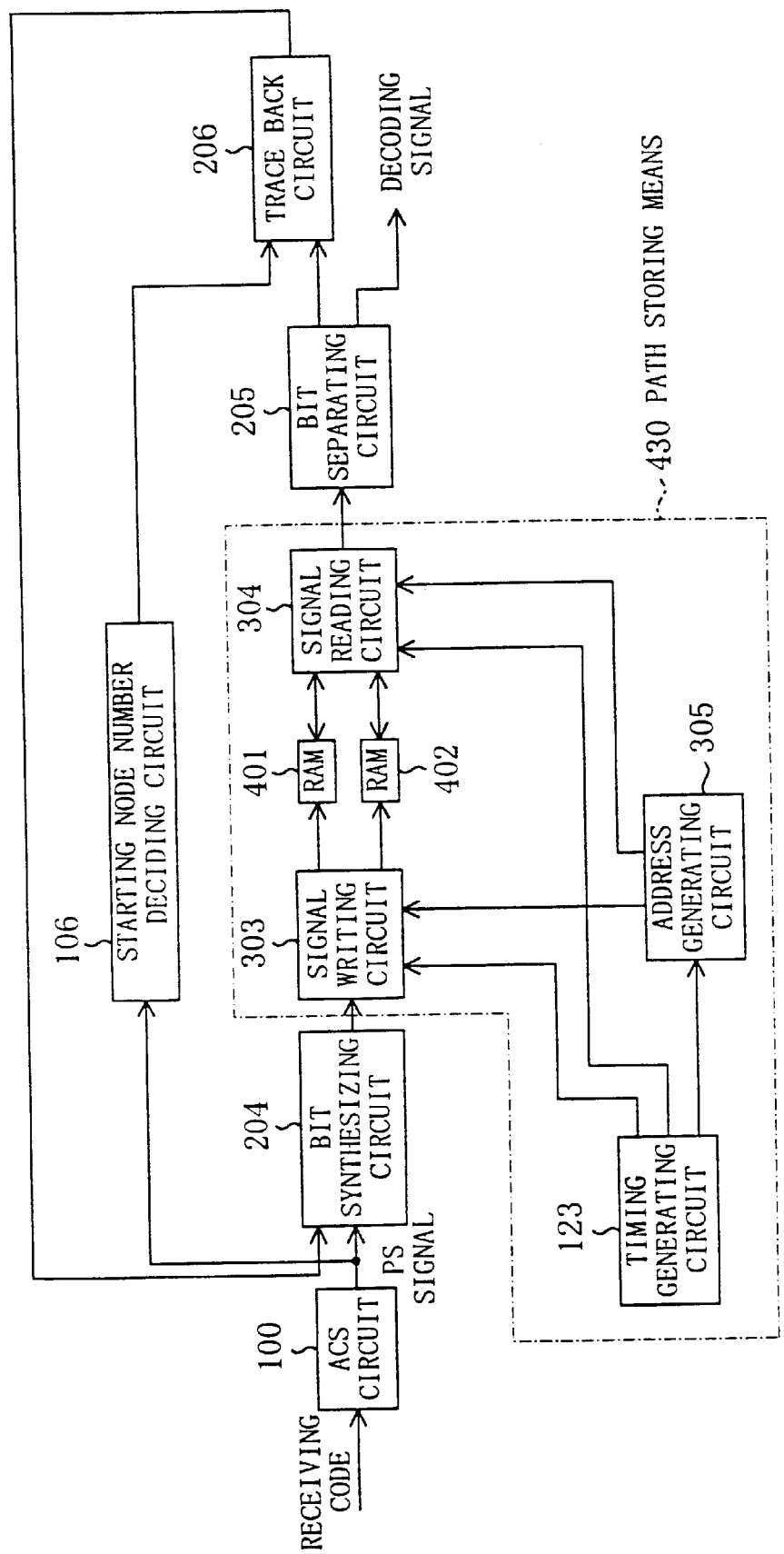
FIG. 11 shows in block form a Viterbi decoder in accordance with a fourth embodiment of the present invention.

FIG. 11 illustrates in block form a Viterbi decoder in accordance with a fourth embodiment of the present invention. As in the foregoing embodiment, m is the trace-back length, K the encoder constraint length, and f the symbol rate.

In FIGS. 1, 5, 8, 11 showing the respective Viterbi decoders of the embodiments of the present invention, like reference numerals have been used to indicate like elements, and they are not described here.

401 is a first memory as a first storage unit. 402 is a second memory as a second storage unit. Each memory 401 and 402 is formed by a multiported RAM, the data bit width of which being $2^{(K-1)}+1$ and the number of words of which being (m+1). By bit synthesizing circuit 204 and signal writing circuit 303, a PS signal produced in ACS circuit 100 and a decoded signal produced in trace-back circuit 203 are combined together for writing to a selected memory. By signal reading circuit 304 and bit separating circuit 205, a signal is read from a selected memory and is divided into a PS signal and a decoded signal.

First memory 401, second memory 402, signal writing circuit 303, signal reading circuit 304, timing generating circuit 123, and address generating circuit 305 together form a path storing means 430.

The operation of the above-described Viterbi decoder is now described. The present embodiment has both the characteristics of the second embodiment and the characteristics of the third embodiment.

Figures 12A, 12B:
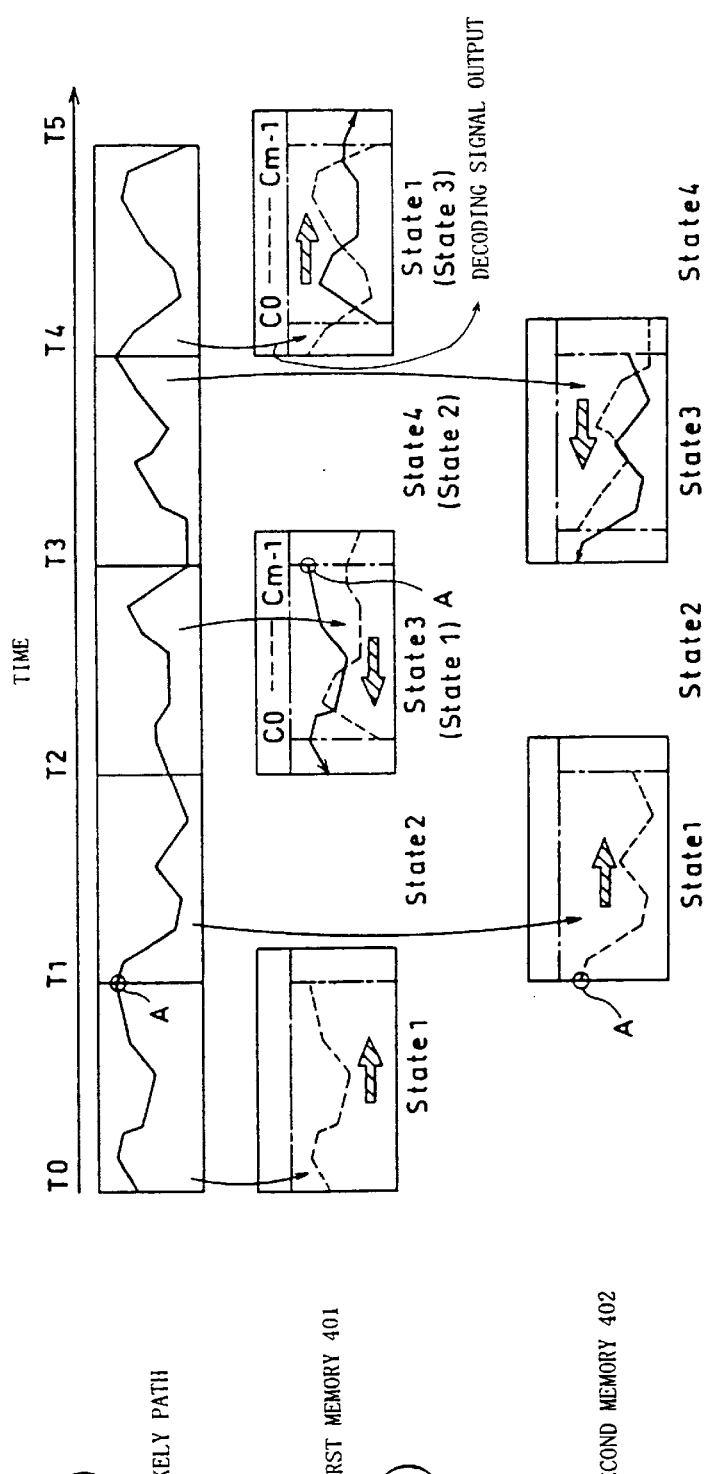
FIG. 12 is a diagram showing details of the operation of the Viterbi decoder in FIG. 11.

Referring now to FIG. 12, the operation of the Viterbi decoder of FIG. 11 is described. FIG. 12(a) is a trellis diagram showing a most likely path formed by input received codes. FIG. 12(b) is a diagram showing the operating states of first and second memories 401 and 402 at respective times.

Suppose here that PS signals are produced from ACS circuit 100 forming the most likely path as shown in FIG. 12(a) in the period from time T0 to time T5. At this time, as shown in FIG. 12(a), each memory 401 and 402 cyclically and repeatedly enters four different states (from the State1 to the State4) in almost the same fashion as in the third embodiment. In FIG. 12(b), each hatched arrow indicates the order in which each memory is accessed.

In the period from time T0 to time T1, first memory 401 is placed in the State1 and output signals from bit synthesizing circuit 204 are sequentially written to at addresses #0 to #(m−1) of first memory 401. Although the output signal of bit synthesizing circuit 204 is a combined bit of a PS signal from ACS circuit 100 and a decoded signal from trace-back circuit 206, only the PS signal is written in first memory 401 because no decoded signal has been obtained at this point in time.

In the period from time T1 to time T2, second memory 402 is placed in the State1, and, as in the State1 of first memory 401, output signals from bit synthesizing circuit 204 are written to at addresses #0 to #(m−1) in sequence. As in the first embodiment, the terminal node number of the most likely path formed by the PS signals written in first memory 401 is detected at time (T2−f) by the operation of starting node number deciding circuit 106. The PS signal at the terminal node has been stored at address #(m−1) of first memory 401.

Next, in the period from time T2 to time T3, first memory 401 is placed in the State3, and, as in the third embodiment, trace-back processing and PS signal writing are carried out concurrently. Items of data at addresses #(m−1) to #0 are read out in sequence. PS signals are separated from the data by bit separating circuit 205, and trace-back is carried out by the operation of trace-back circuit 206 in the same manner as in the second embodiment. Additionally, the decoded signals from trace-back circuit 206 are combined with the PS signals from ACS circuit 100 in bit synthesizing circuit 204 for writing to at addresses #m to #1 of first memory 401 in sequence.

For example, decoded signals obtained from PS signals stored at address #(m−1) of first memory 401 are temporarily stored in specific bits at address #m of first memory 401 (the bit at the top in FIG. 12). As a result, the decoded signals in the period from time T1 to time T2 are stored, in a reverse sequence in time, in specific bits at addresses #1 to #m of first memory 401.

In the period from time T3 to time T4, second memory 402 is placed in the State3, and, as in the State3 of first memory 401, trace-back operation is carried out from addresses #(m−1) to #0. Concurrently with this, PS signals and decoded signals are written to at addresses #m to #1.

In the period from time T4 to time T5, first memory 401 is replaced in the State1, and output signals from bit synthesizing circuit 204 are sequentially written to at addresses #0 to #(m−1) of first memory 401 and, at the same time, trace-back operation is performed from address #1 to address #m. The data, read out in the trace-back operation, is divided by bit separating circuit 205 into a PS signal and a decoded signal. This decoded signal becomes a time-correct decoded signal.

The decoded signals obtained by trace-back operation are combined with new PS signals in bit synthesizing circuit 204 and are stored in specific bits at addresses #0 to #(m−1) in a time-reversed sequence. Since the decoded signals are read out in sequence from at addresses #(m−1) to #0 with the operation of trace-back in the next State3, the decoded signals become time-correct decoded signals.

Thereafter, the like operations are repeated to perform decoding.

Such arrangement makes it possible to efficiently use trace-back memory by the setting of offset values to read and write addresses and by continuously writing new PS signals to at read-completed addresses. This achieves a considerable reduction of the memory storage capacity. Additionally, it is unnecessary to provide a circuit, such as LIFO for time relationship correction, required in a trace-back means, thereby accomplishing a reduced circuit size.

The present embodiment employs a structure in which separate multiported memories are used. However, such may be achieved easily using a single multiported memory whose storage capacity is equal to the total storage capacity of the two multiported memories.

The bit width of each memory in the present embodiment is greater by one than in the third embodiment. The reason is that the number of bits of a decoded signal is one. However, the memory bit width may be increased with the number of decoded signal bits.

Fifth Embodiment

Figure 13:
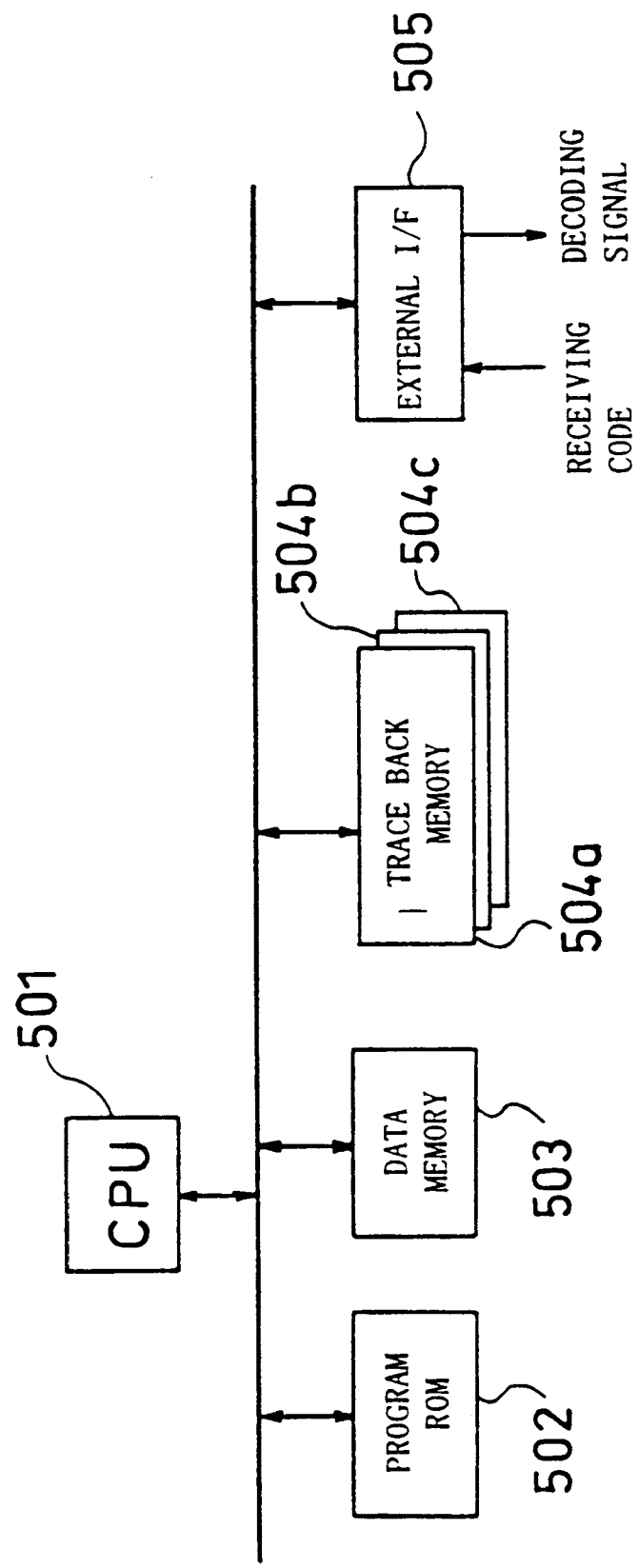
FIG. 13 shows in block form a Viterbi decoder in accordance with a fifth embodiment of the present invention.
Figure 14:
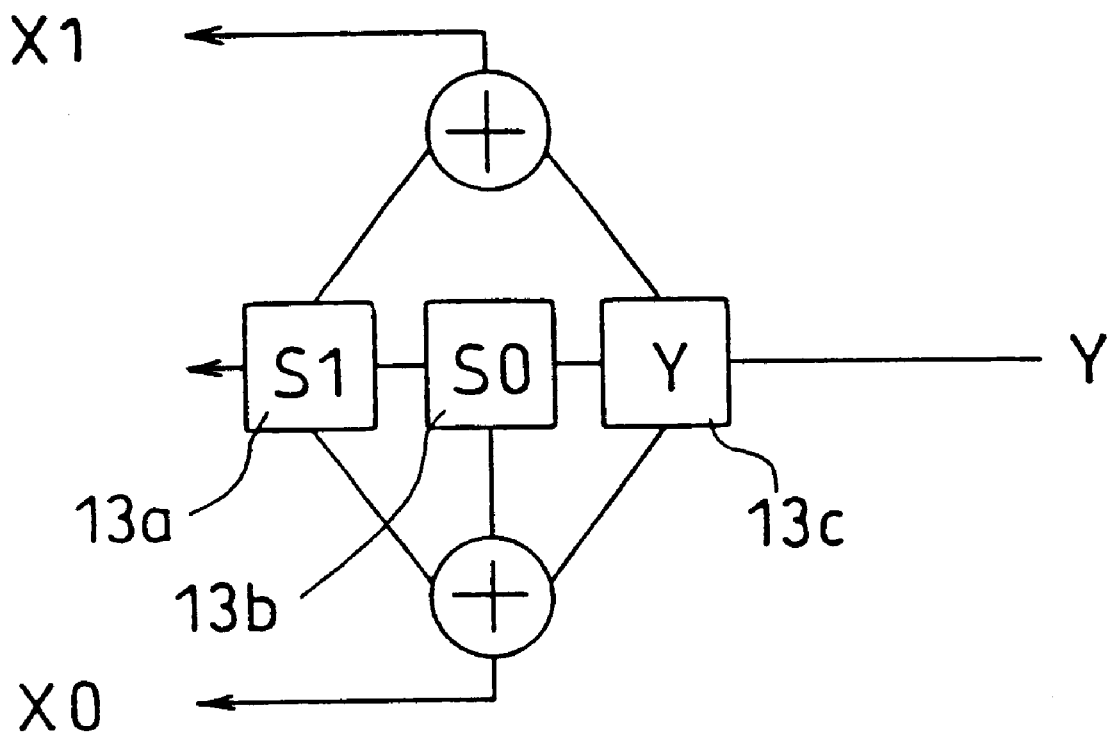
FIG. 14 is a diagram depicting a convolutional code encoder.
Figure 15A:
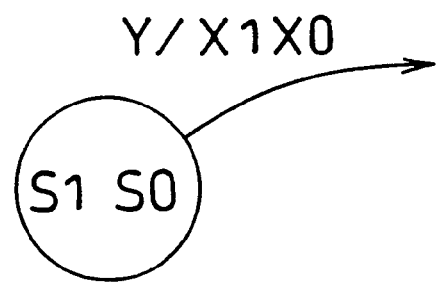
FIG. 15 is a state transition diagram showing the operation of the convolutional code encoder in FIG. 14.
Figure 15B:
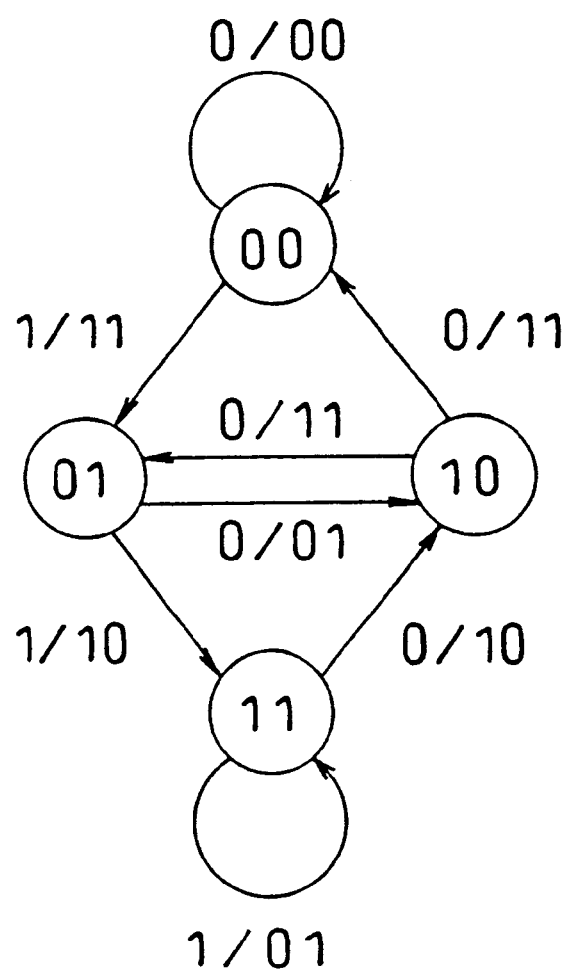
Figure 16:
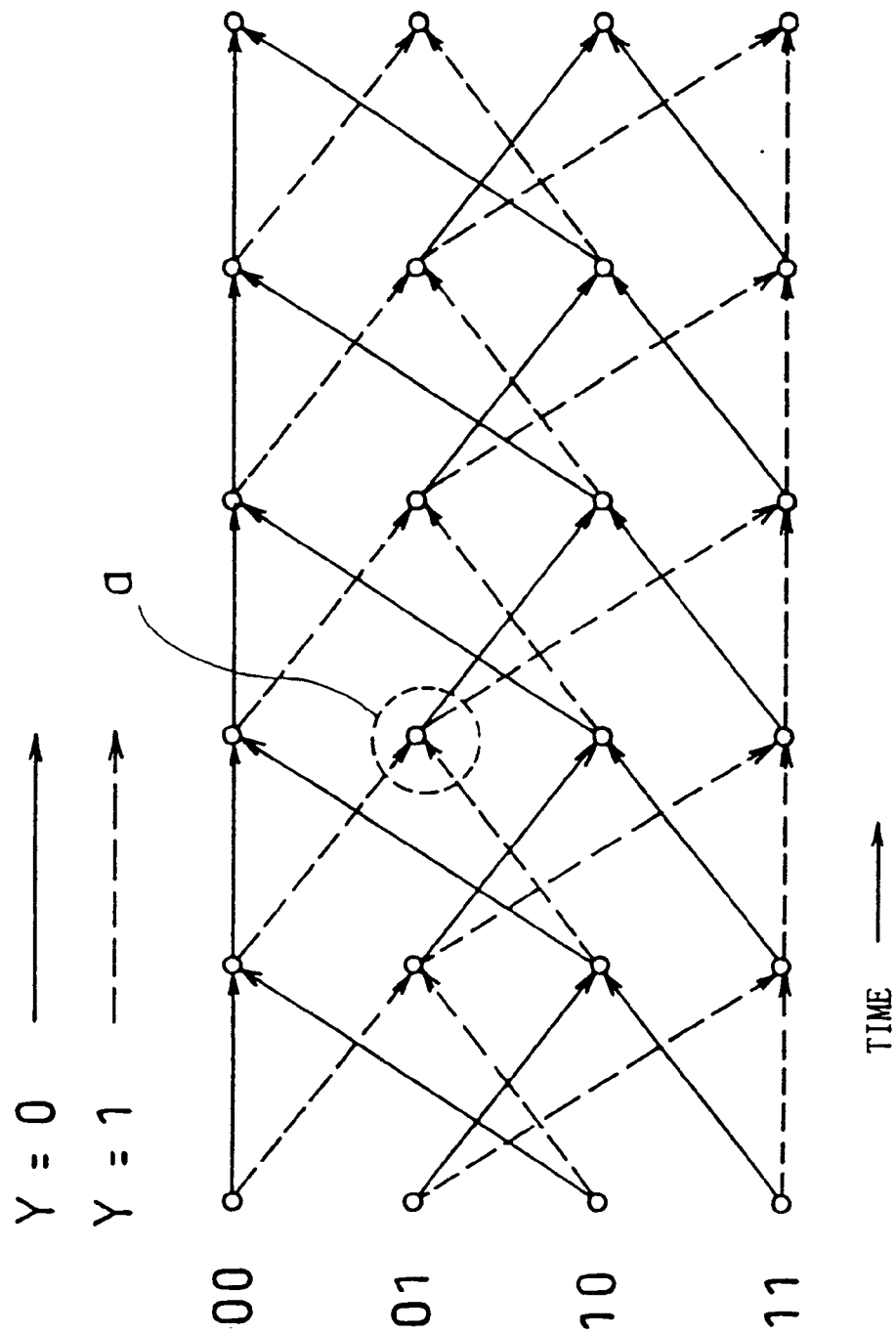
FIG. 16 is a trellis diagram showing the operation of the convolutional code encoder in FIG. 14.
Figure 17:
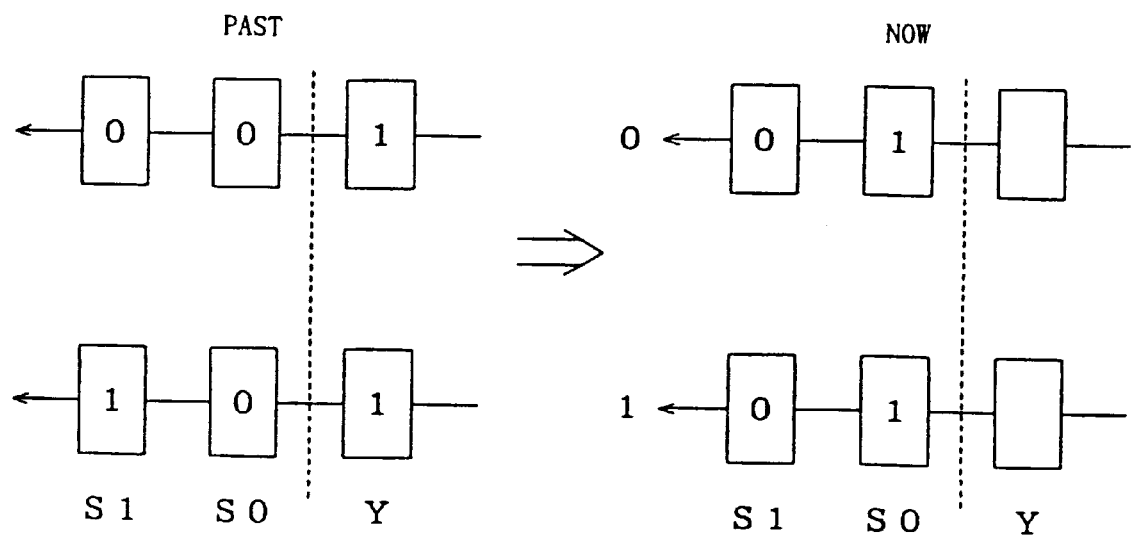
FIG. 17 is a diagram showing details of the operation of the convolutional code encoder in FIG. 14.
Figure 18:
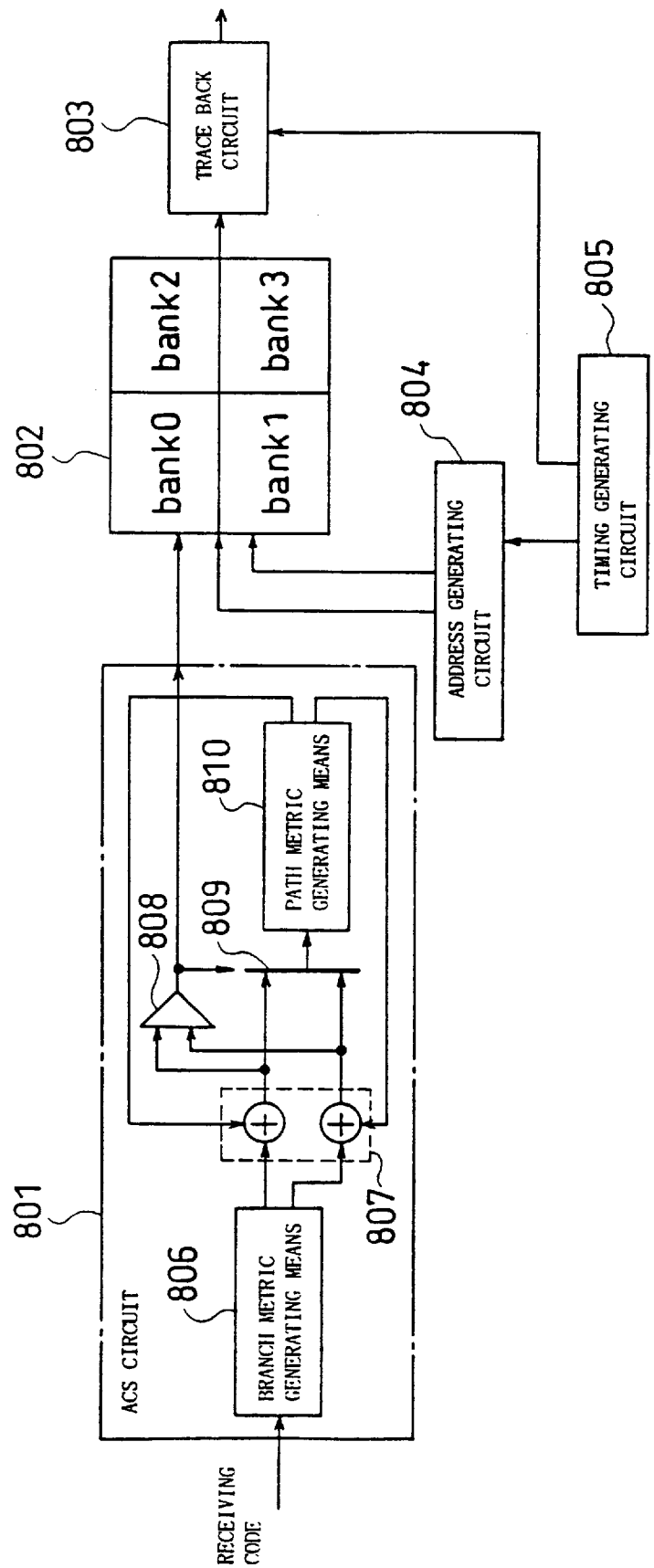
FIG. 18 shows in block form a prior art technique Viterbi decoder.
Figures 19A, 19B:
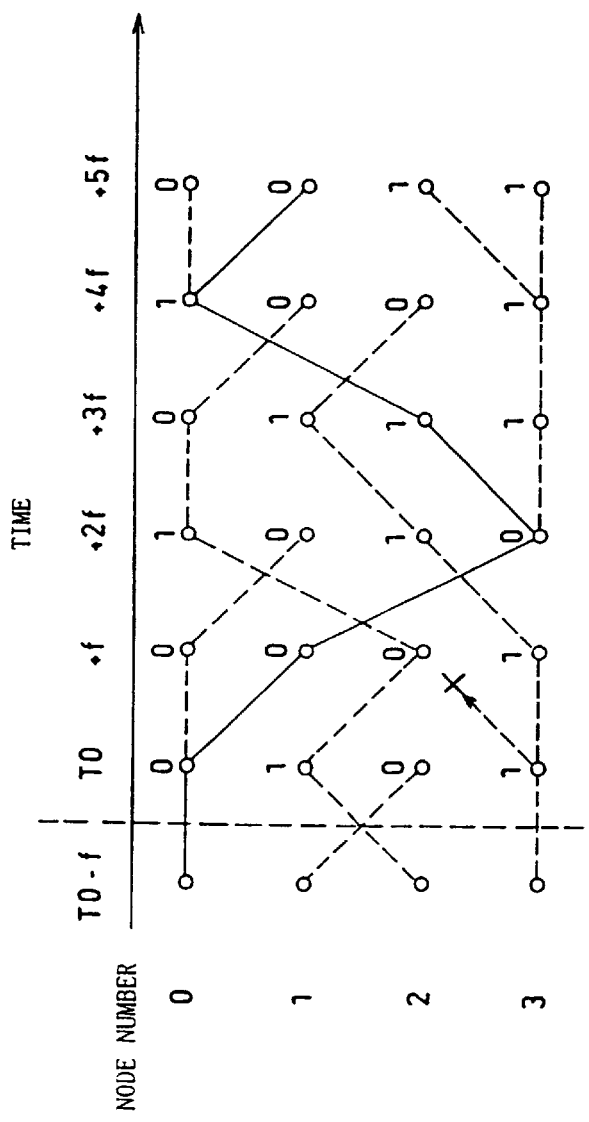
FIG. 19 is a diagram showing details of the operation of the Viterbi decoder in FIG. 18.
Figures 20A, 20B:
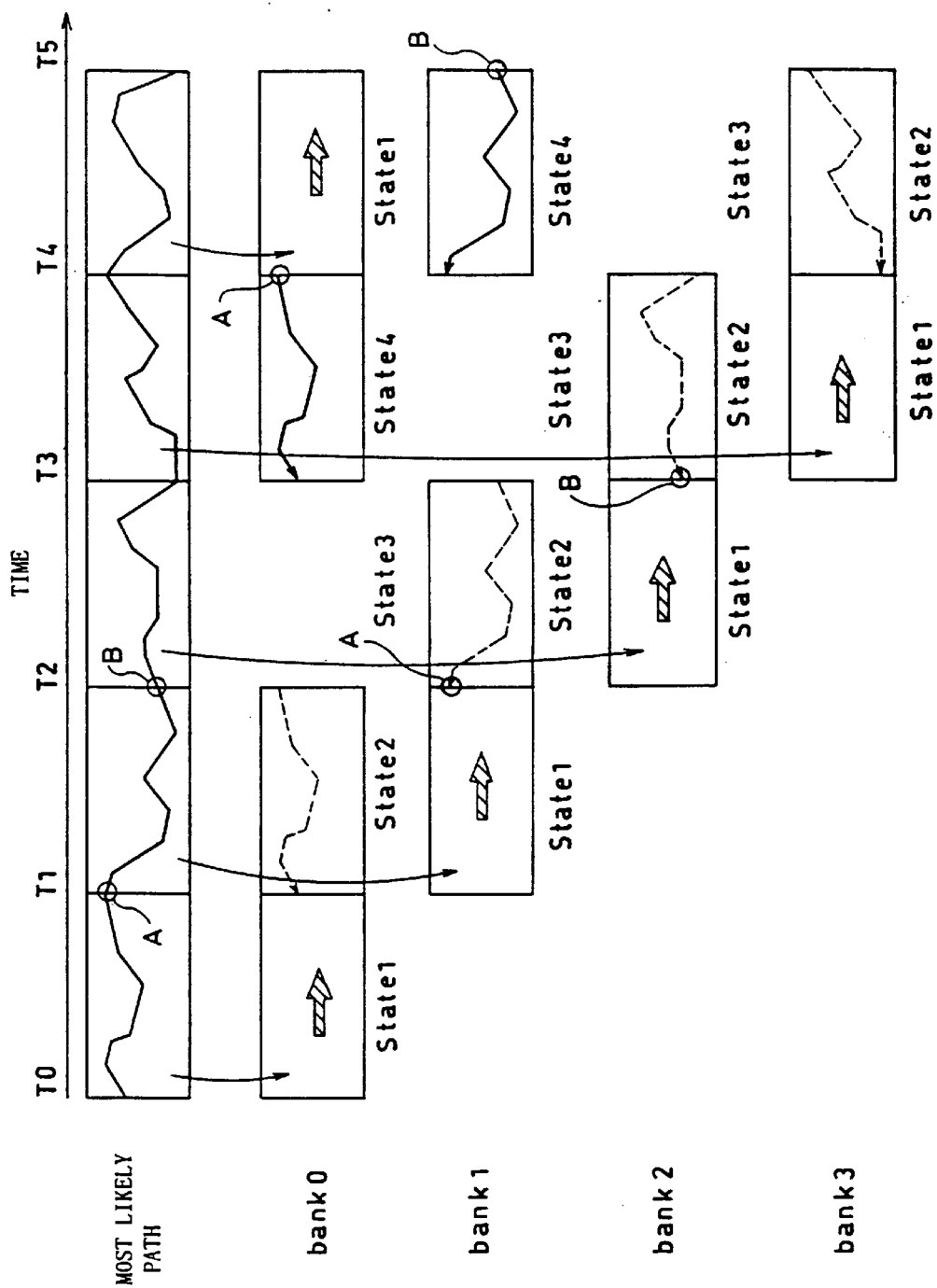
FIG. 20 is a diagram showing details of the operation of the Viterbi decoder in FIG. 18.

FIG. 13 shows in block form a Viterbi decoder in accordance with a fifth embodiment of the present invention. 501 is a CPU (central processing unit). 502 is a program ROM (read-only memory) which stores a program of Viterbi decoding. 503 is a data memory. 504a is a trace-back memory as a first storage unit. 504b is a trace-back memory as a second storage unit. 504c is a trace-back memory as a third storage unit. 505 is an external interface (I/F) for accepting received codes and providing decoded signals.

The data bit width and the number of words of each trace-back memory 504a–c are $2^{(K-1)}$ and m, respectively, where m is the trace-back length and K is the encoder constraint length. The symbol rate is f.

A Viterbi decoding method by the FIG. 13 Viterbi decoder is explained below.

The loading of a Viterbi decoding program from program ROM 502 is directed by CPU 501. The following operations are performed according to the loaded Viterbi decoding program.

Received codes are stored, through external interface 505, in data memory 503. PS signals are obtained from the received codes stored in data memory 503 (the path select signal generation processing) and are sequentially stored in one of trace-back memories 504a–c (that is, after m PS signals are stored in a trace-back memory, PS signals are stored in another. Additionally, m PS signals are stored in a trace-back memory and, at the same time, a node number through which the most likely path passes in a PS signal just before the m PS signals is found, the found node number being stored in data memory 503 as a starting node number (the starting node number deciding processing).

Next, a trace-back operation is performed on m PS signals which use the found starting node number as a most likely path terminal node number. A trace-back memory that stores the m PS signals is read such that the m PS signals are obtained in a sequence opposite to that in which they were stored, and a trace-back is carried out for signal decoding (the trace-back processing).

As in the first embodiment, the operating state of each trace-back memory 504a–c cyclically changes to the State1, to the State2, and to the State3 in that order at time intervals of (m×f). In the State1, the starting node number deciding processing is carried out to each trace-back memory 504. In the State2, no processing is carried out. The trace-back processing is carried out in the State3.

Finally, decoded signals are temporarily stored in data memory 503, are time-reversed, and are provided through external interface 505.

The above-described method achieves a considerable reduction of the trace-back memory storage capacity. Additionally, a commonly-used RAM may be employed to implement a trace-back memory thereby making it possible to reduce the consumption of electric power. Further, the write cycle and the decoding cycle of PS signal are arranged to be the same thereby achieving high-speed decoding processing.

The generating of PS signals and the process of deciding a starting node number may be executed in functional blocks other than the CPU, thereby relieving the load of the CPU to provide faster operations. Hardware may be reduced in size by storing respective data, not in data memory 503 but in internal registers within the CPU.

Instead of using trace-back memories 504a–c, two multiported memories, the bit width of which being $2^{(K-1)}$ and the number of words of which being (m+1), may be employed. The operating state of each of the two trace-back memories (i.e., the first and second storage units) cyclically changes to the State1, to the State2, to the State3, and to the State4 at time intervals of (m×f). In the State1, starting node number deciding processing is performed on each trace-back memory for the writing of PS signals from the leading address, and trace-back processing is also performed on each trace-back memory for the tracing back of written PS signals from the last address. In the State3, starting node number deciding processing is performed on each trace-back memory for the writing of PS signals starting with the last address, and trace-back processing is also performed on each trace-back memory for the tracing back of written PS signals staring with the leasing address. Neither in the State2 nor in the State4, processing is carried out.

As a result of such arrangement, it becomes possible to efficiently use trace-back memories and the memory storage capacity required for signal decoding can be reduced to a further extent.

In the above description, the trace-back length (m) is about six for the sake of providing an easy understanding of the present invention. However, other trace-back length values may be used depending on systems employed.

The invention claimed is:

1. A Viterbi decoding method for decoding convolution-coded received codes by a path trace technique wherein the constraint length of an encoder on the sending side is K and the trace-back length is m, each of K and m being a positive integer, the decoding method comprising the steps of:

generating, in response to each of said received codes, a path select signal of $2^{(K-1)}$ bits, each of said $2^{(K-1)}$ bits corresponding to a respective node indicative of a state of said encoder;

combining first m path select signals generated in said step of generating a path select signal of $2^{(K-1)}$ bits and m decoded signals decoded by trace-back from second m path select signals generated before said first m path select signals, and writing the combined signals in a storage unit.

2. The Viterbi decoding method of claim 1, further comprising the steps of:

reading the combined signals from said storage unit in a sequence opposite to that in which said combined signals have been written and dividing said combined signals into path select signals and decoded signals.

3. The Viterbi decoding method of claim 1, further comprising the steps of:

determining a starting node number which is a node number through which a most likely path passes of a last path select signal in said second m path select signals; and obtaining said m decoded signals by sequentially performing trace-back operations on said second m path select signals from a bit corresponding to said starting node number determined by said step of determining a starting node number.

4. The Viterbi decoding method of claim 3, wherein said second m path select signals have been generated just before said first m path select signals, and said step of determining a starting node number includes a step of determining, together with writing said combined signals in said storage unit, a node number through which a most likely path passes of a path select signal just before said first m path select signals, that is said last path select signal in said second m path select signals, as said starting node number.

* * * * *